United States Patent
Zohni et al.

(10) Patent No.: US 9,312,244 B2
(45) Date of Patent: *Apr. 12, 2016

(54) MULTIPLE DIE STACKING FOR TWO OR MORE DIE

(71) Applicant: Tessera, Inc., San Jose, CA (US)

(72) Inventors: Wael Zohni, San Jose, CA (US); Belgacem Haba, Saratoga, CA (US)

(73) Assignee: Tessera, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/617,236

(22) Filed: Feb. 9, 2015

(65) Prior Publication Data

US 2015/0155269 A1    Jun. 4, 2015

Related U.S. Application Data

(63) Continuation of application No. 13/658,401, filed on Oct. 23, 2012, now Pat. No. 8,952,516, which is a continuation-in-part of application No. 13/306,203, filed on Nov. 29, 2011, now Pat. No. 8,633,576.

(60) Provisional application No. 61/477,820, filed on Apr. 21, 2011.

(51) Int. Cl.
*H01L 23/02* (2006.01)
*H01L 23/48* (2006.01)
(Continued)

(52) U.S. Cl.
CPC ............ *H01L 25/0657* (2013.01); *H01L 23/13* (2013.01); *H01L 23/4951* (2013.01);
(Continued)

(58) Field of Classification Search
CPC ................ H01L 2924/00; H01L 2924/00012; H01L 2924/014; H01L 2924/07811; H01L 2924/3011; H01L 2924/00011; H01L 2924/206; H01L 2924/01087; H01L
(Continued)

(56) References Cited

U.S. PATENT DOCUMENTS 4,941,033 A  7/1990  Kishida
5,138,438 A  8/1992  Masayuki et al.
(Continued)

FOREIGN PATENT DOCUMENTS

CN  101055840 A  10/2007
JP  62107391  5/1987
(Continued)

OTHER PUBLICATIONS

Japanese Office Action for Application No. 2014-506417 dated Apr. 14, 2015.
(Continued)

*Primary Examiner* — Teresa M Arroyo
(74) *Attorney, Agent, or Firm* — Lerner, David, Littenberg, Krumholz & Mentlik, LLP

(57) ABSTRACT

A microelectronic package can include a substrate having first and second opposed surfaces, and first and second microelectronic elements having front surfaces facing the first surface. The substrate can have a plurality of substrate contacts at the first surface and a plurality of terminals at the second surface. Each microelectronic element can have a plurality of element contacts at the front surface thereof. The element contacts can be joined with corresponding ones of the substrate contacts. The front surface of the second microelectronic element can partially overlie a rear surface of the first microelectronic element and can be attached thereto. The element contacts of the first microelectronic element can be arranged in an area array and are flip-chip bonded with a first set of the substrate contacts. The element contacts of the second microelectronic element can be joined with a second set of the substrate contacts by conductive masses.

21 Claims, 21 Drawing Sheets

(51) Int. Cl.
| | |
|---|---|
| *H01L 23/52* | (2006.01) |
| *H01L 29/40* | (2006.01) |
| *H01L 25/065* | (2006.01) |
| *H01L 23/13* | (2006.01) |
| *H01L 23/495* | (2006.01) |
| *H01L 25/10* | (2006.01) |
| *H01L 23/498* | (2006.01) |
| *H01L 23/00* | (2006.01) |
| *H01L 23/31* | (2006.01) |

(52) U.S. Cl.
CPC .... *H01L23/49575* (2013.01); *H01L 23/49816* (2013.01); *H01L 24/73* (2013.01); *H01L 25/0652* (2013.01); *H01L 25/105* (2013.01); *H01L 23/3128* (2013.01); *H01L 24/06* (2013.01); *H01L 24/13* (2013.01); *H01L 24/16* (2013.01); *H01L 24/29* (2013.01); *H01L 24/32* (2013.01); *H01L 24/48* (2013.01); *H01L 2224/0401* (2013.01); *H01L 2224/04042* (2013.01); *H01L 2224/05554* (2013.01); *H01L 2224/06135* (2013.01); *H01L 2224/06136* (2013.01); *H01L 2224/06155* (2013.01); *H01L 2224/06156* (2013.01); *H01L 2224/131* (2013.01); *H01L 2224/13005* (2013.01); *H01L 2224/13017* (2013.01); *H01L 2224/13099* (2013.01); *H01L 2224/13111* (2013.01); *H01L 2224/13147* (2013.01); *H01L 2224/16* (2013.01); *H01L 2224/16225* (2013.01); *H01L 2224/291* (2013.01); *H01L 2224/2919* (2013.01); *H01L 2224/29034* (2013.01); *H01L 2224/29191* (2013.01); *H01L 2224/32145* (2013.01); *H01L 2224/32225* (2013.01); *H01L 2224/32245* (2013.01); *H01L 2224/4824* (2013.01); *H01L 2224/4826* (2013.01); *H01L 2224/48227* (2013.01); *H01L 2224/49109* (2013.01); *H01L 2224/49175* (2013.01); *H01L 2224/73203* (2013.01); *H01L 2224/73215* (2013.01); *H01L 2224/73253* (2013.01); *H01L 2224/73265* (2013.01); *H01L 2225/0651* (2013.01); *H01L 2225/06517* (2013.01); *H01L 2225/06558* (2013.01); *H01L 2225/06562* (2013.01); *H01L 2225/06565* (2013.01); *H01L 2225/107* (2013.01); *H01L 2225/1023* (2013.01); *H01L 2924/01013* (2013.01); *H01L 2924/01029* (2013.01); *H01L 2924/01078* (2013.01); *H01L 2924/01079* (2013.01); *H01L 2924/01087* (2013.01); *H01L 2924/01322* (2013.01); *H01L 2924/07811* (2013.01); *H01L*

(58) Field of Classification Search
CPC ............. 2924/14 (2013.01); *H01L 2924/15311* (2013.01); *H01L 2924/3011* (2013.01) 2924/01322; H01L 2224/49109; H01L 2224/73265; H01L 2224/48227; H01L 2224/4824; H01L 2224/4826; H01L 2224/73215; H01L 2224/32145; H01L 2224/32225; H01L 2224/29191; H01L 2224/32245; H01L 2224/49175; H01L 2224/13005; H01L 2224/131; H01L 2224/29034; H01L 2224/291; H01L 2224/73203; H01L 2224/0401; H01L 2224/04042; H01L 2224/73253; H01L 2224/05554; H01L 2224/06135; H01L 2224/06136; H01L 2224/06155; H01L 2224/06156; H01L 2224/13017; H01L 2224/13111; H01L 2224/13147; H01L 2224/16225; H01L 2224/2919; H01L 2225/0651; H01L 2225/06517; H01L 2225/06558; H01L 2225/06562; H01L 2225/06565; H01L 2225/1023; H01L 2225/107; H01L 23/13; H01L 23/3128; H01L 23/4951; H01L 23/49575; H01L 23/49816; H01L 24/06; H01L 24/13; H01L 24/16; H01L 24/29; H01L 24/32; H01L 24/48; H01L 24/73; H01L 25/0652; H01L 25/0657; H01L 25/105; H01L 2924/01079; H01L 2924/01029; H01L 2924/01013; H01L 2924/01078; H01L 2924/15311; H01L 2924/14; H01L 2224/13099; H01L 2224/16
USPC .......................... 257/686, 777, 772, 778, 779
See application file for complete search history.

(56) References Cited

U.S. PATENT DOCUMENTS

| | | |
|---|---|---|
| 5,148,265 A | 9/1992 | Khandros et al. |
| 5,148,266 A | 9/1992 | Khandros et al. |
| 5,222,014 A | 6/1993 | Lin |
| 5,347,159 A | 9/1994 | Khandros et al. |
| 5,480,840 A | 1/1996 | Barnes et al. |
| 5,679,977 A | 10/1997 | Khandros et al. |
| 5,804,874 A | 9/1998 | An et al. |
| 5,861,666 A | 1/1999 | Bellaar |
| 5,883,426 A | 3/1999 | Tokuno et al. |
| 5,977,640 A | 11/1999 | Bertin et al. |
| 5,998,864 A | 12/1999 | Khandros et al. |
| 6,021,048 A | 2/2000 | Smith |
| 6,072,233 A | 6/2000 | Corisis et al. |
| 6,093,029 A | 7/2000 | Kwon et al. |
| 6,150,724 A | 11/2000 | Wenzel et al. |
| 6,169,325 B1 | 1/2001 | Azuma et al. |
| 6,180,881 B1 | 1/2001 | Isaak |
| 6,199,743 B1 | 3/2001 | Bettinger et al. |
| 6,218,728 B1 | 4/2001 | Kimura |
| 6,218,731 B1 | 4/2001 | Huang et al. |
| 6,268,649 B1 | 7/2001 | Corisis et al. |
| 6,335,565 B1 | 1/2002 | Miyamoto et al. |
| 6,353,539 B1 | 3/2002 | Horine et al. |
| 6,369,448 B1 | 4/2002 | McCormick |
| 6,385,049 B1 | 5/2002 | Chia-Yu et al. |
| 6,392,292 B1 | 5/2002 | Morishita |
| 6,414,396 B1 | 7/2002 | Shim et al. |
| 6,426,560 B1 | 7/2002 | Kawamura et al. |
| 6,445,594 B1 | 9/2002 | Nakagawa et al. |
| 6,472,741 B1 | 10/2002 | Chen et al. |
| 6,492,726 B1 | 12/2002 | Quek et al. |
| 6,583,502 B2 | 6/2003 | Lee et al. |
| 6,703,713 B1 | 3/2004 | Tseng et al. |
| 6,720,666 B2 | 4/2004 | Lim et al. |
| 6,731,009 B1 | 5/2004 | Jones et al. |
| 6,734,542 B2 | 5/2004 | Nakatani et al. |
| 6,742,098 B1 | 5/2004 | Halbert et al. |
| 6,762,942 B1 | 7/2004 | Smith |
| 6,793,116 B2 | 9/2004 | Harada |
| 6,811,580 B1 | 11/2004 | Littecke |
| 6,818,474 B2 | 11/2004 | Kim et al. |
| 6,977,440 B2 | 12/2005 | Pflughaupt et al. |
| 7,061,105 B2 | 6/2006 | Masuda et al. |
| 7,061,121 B2 | 6/2006 | Haba |
| 7,095,104 B2 | 8/2006 | Blackshear |
| 7,205,656 B2 | 4/2007 | Kim et al. |
| 7,389,937 B2 | 6/2008 | Ito |
| 7,462,936 B2 | 12/2008 | Haba et al. |
| 7,504,284 B2 | 3/2009 | Ye et al. |
| 7,633,146 B2 | 12/2009 | Masuda et al. |
| 7,638,868 B2 | 12/2009 | Haba |
| 7,855,462 B2 | 12/2010 | Boon et al. |
| 7,880,310 B2 | 2/2011 | Mathew |
| 7,892,889 B2 | 2/2011 | Howard et al. |
| 7,969,006 B2 | 6/2011 | Lin et al. |
| 8,026,589 B1 | 9/2011 | Kim et al. |

(56) References Cited

U.S. PATENT DOCUMENTS

| | | |
|---|---|---|
| 8,254,155 B1 | 8/2012 | Crisp et al. |
| 8,288,862 B2 | 10/2012 | Khiang et al. |
| 8,304,881 B1 | 11/2012 | Haba et al. |
| 8,378,478 B2 | 2/2013 | Desai et al. |
| RE45,463 E | 4/2015 | Haba |
| 2001/0005311 A1 | 6/2001 | Duesman et al. |
| 2002/0030267 A1 | 3/2002 | Suzuki |
| 2002/0053727 A1 | 5/2002 | Kimura |
| 2002/0175421 A1 | 11/2002 | Kimura |
| 2003/0064547 A1 | 4/2003 | Akram et al. |
| 2003/0116349 A1 | 6/2003 | Hashimoto |
| 2003/0179549 A1 | 9/2003 | Zhong et al. |
| 2003/0183917 A1 | 10/2003 | Tsai et al. |
| 2003/0193788 A1 | 10/2003 | Farnworth et al. |
| 2003/0224553 A1 | 12/2003 | Manansala |
| 2004/0016939 A1 | 1/2004 | Akiba et al. |
| 2004/0016999 A1 | 1/2004 | Misumi |
| 2004/0124520 A1 | 7/2004 | Rinne |
| 2004/0184240 A1 | 9/2004 | Su |
| 2004/0262774 A1 | 12/2004 | Kang et al. |
| 2005/0110125 A1 | 5/2005 | Blackshear |
| 2005/0110162 A1 | 5/2005 | Meyer-Berg et al. |
| 2005/0116326 A1 | 6/2005 | Haba et al. |
| 2005/0116358 A1 | 6/2005 | Haba |
| 2005/0133932 A1 | 6/2005 | Pohl et al. |
| 2005/0164486 A1 | 7/2005 | Lua et al. |
| 2005/0173807 A1 | 8/2005 | Zhu et al. |
| 2005/0218514 A1 | 10/2005 | Massingill |
| 2005/0258538 A1 | 11/2005 | Gerber |
| 2006/0006405 A1 | 1/2006 | Mazzochette |
| 2006/0027902 A1 | 2/2006 | Ararao et al. |
| 2006/0081583 A1 | 4/2006 | Hembree et al. |
| 2006/0097379 A1 | 5/2006 | Wang |
| 2006/0097400 A1 | 5/2006 | Cruz et al. |
| 2006/0113653 A1 | 6/2006 | Xiaoqi et al. |
| 2006/0145323 A1 | 7/2006 | Lee |
| 2006/0197210 A1 | 9/2006 | Kim |
| 2006/0231938 A1 | 10/2006 | Mangrum |
| 2006/0249827 A1 | 11/2006 | Fasano et al. |
| 2006/0290005 A1 | 12/2006 | Thomas et al. |
| 2007/0066139 A1 | 3/2007 | Roeper et al. |
| 2007/0075409 A1 | 4/2007 | Letterman et al. |
| 2007/0108592 A1 | 5/2007 | Lai et al. |
| 2007/0120238 A1 | 5/2007 | Vaiyapuri |
| 2007/0152310 A1 | 7/2007 | Osborn et al. |
| 2007/0160817 A1 | 7/2007 | Roh |
| 2007/0164407 A1 | 7/2007 | Jun et al. |
| 2007/0176297 A1 | 8/2007 | Zohni |
| 2007/0176298 A1 | 8/2007 | Osone et al. |
| 2007/0181989 A1 | 8/2007 | Corisis et al. |
| 2007/0218689 A1 | 9/2007 | Ha et al. |
| 2007/0235886 A1 | 10/2007 | Yilmaz et al. |
| 2007/0257376 A1 | 11/2007 | Shimokawa et al. |
| 2008/0001241 A1 | 1/2008 | Tuckerman et al. |
| 2008/0001309 A1 | 1/2008 | Tago |
| 2008/0023805 A1 | 1/2008 | Howard et al. |
| 2008/0036067 A1 | 2/2008 | Lin |
| 2008/0042249 A1 | 2/2008 | Haba |
| 2008/0048777 A1 | 2/2008 | Kohjiro et al. |
| 2008/0073777 A1 | 3/2008 | Cui et al. |
| 2008/0093725 A1 | 4/2008 | Jung et al. |
| 2008/0116557 A1 | 5/2008 | Paek et al. |
| 2008/0122067 A1 | 5/2008 | Wang |
| 2008/0136006 A1 | 6/2008 | Jang et al. |
| 2008/0237844 A1 | 10/2008 | Aleksov et al. |
| 2008/0237887 A1 | 10/2008 | Takiar et al. |
| 2008/0237891 A1 | 10/2008 | Irsigler et al. |
| 2008/0246130 A1 | 10/2008 | Carney et al. |
| 2008/0296717 A1 | 12/2008 | Beroz et al. |
| 2008/0303153 A1 | 12/2008 | Oi et al. |
| 2008/0315377 A1 | 12/2008 | Eichelberger et al. |
| 2009/0017583 A1 | 1/2009 | Jun et al. |
| 2009/0045524 A1 | 2/2009 | Mohammed et al. |
| 2009/0051043 A1 | 2/2009 | Wong et al. |
| 2009/0057864 A1 | 3/2009 | Choi et al. |
| 2009/0068858 A1 | 3/2009 | Di Stefano |
| 2009/0079061 A1 | 3/2009 | Mallik et al. |
| 2009/0104734 A1 | 4/2009 | Specht et al. |
| 2009/0108422 A1 | 4/2009 | Sasaki et al. |
| 2009/0166839 A1 | 7/2009 | Suzuki et al. |
| 2009/0168366 A1 | 7/2009 | Clayton et al. |
| 2009/0179321 A1 | 7/2009 | Sakamoto et al. |
| 2009/0185317 A1 | 7/2009 | Dijkhuis et al. |
| 2009/0200652 A1 | 8/2009 | Oh et al. |
| 2009/0200680 A1 | 8/2009 | Shinohara et al. |
| 2009/0236700 A1 | 9/2009 | Moriya |
| 2009/0243064 A1 | 10/2009 | Camacho et al. |
| 2009/0256266 A1 | 10/2009 | Lao et al. |
| 2009/0267222 A1 | 10/2009 | Zhong et al. |
| 2010/0019377 A1 | 1/2010 | Arvelo et al. |
| 2010/0044861 A1 | 2/2010 | Chiu et al. |
| 2010/0065955 A1 | 3/2010 | Chye et al. |
| 2010/0072602 A1 | 3/2010 | Sutardja |
| 2010/0090326 A1 | 4/2010 | Baek et al. |
| 2010/0127044 A1 | 5/2010 | Ota et al. |
| 2010/0127362 A1 | 5/2010 | Fan et al. |
| 2010/0133665 A1 | 6/2010 | Ha et al. |
| 2010/0193930 A1 | 8/2010 | Lee |
| 2010/0230795 A1 | 9/2010 | Kriman et al. |
| 2010/0244278 A1 | 9/2010 | Shen |
| 2010/0258928 A1 | 10/2010 | Chi et al. |
| 2010/0295166 A1 | 11/2010 | Kim |
| 2010/0314740 A1 | 12/2010 | Choi et al. |
| 2010/0321885 A1 | 12/2010 | Huang |
| 2010/0327419 A1 | 12/2010 | Muthukumar et al. |
| 2011/0079905 A1 | 4/2011 | Sanchez et al. |
| 2011/0085304 A1 | 4/2011 | Bindrup et al. |
| 2011/0193582 A1 | 8/2011 | Cho |
| 2012/0091574 A1 | 4/2012 | Lin et al. |
| 2012/0092832 A1 | 4/2012 | Haba et al. |
| 2012/0126389 A1 | 5/2012 | Desai et al. |
| 2012/0153435 A1 | 6/2012 | Haba et al. |
| 2012/0267796 A1 | 10/2012 | Haba et al. |
| 2012/0267798 A1 | 10/2012 | Haba et al. |
| 2013/0015586 A1 | 1/2013 | Crisp et al. |
| 2013/0082394 A1 | 4/2013 | Crisp et al. |
| 2013/0099387 A1 | 4/2013 | Caskey et al. |
| 2013/0168843 A1 | 7/2013 | Zohni |
| 2013/0249116 A1 | 9/2013 | Mohammed et al. |
| 2014/0035121 A1 | 2/2014 | Haba et al. |

FOREIGN PATENT DOCUMENTS

| | | |
|---|---|---|
| JP | H11345932 A | 12/1999 |
| JP | 2001196407 A | 7/2001 |
| JP | 2001223324 A | 8/2001 |
| JP | 2002-076252 A | 3/2002 |
| JP | 2003-101207 | 4/2003 |
| JP | 2004-063767 A | 2/2004 |
| JP | 2005166892 A | 6/2005 |
| JP | 2005251957 A | 9/2005 |
| JP | 2006079629 A | 3/2006 |
| JP | 2006093189 A | 4/2006 |
| JP | 2006-210892 | 8/2006 |
| JP | 2008177241 A | 7/2008 |
| JP | 2008-198841 A | 8/2008 |
| JP | 2008187146 A | 8/2008 |
| JP | 2008-235576 | 10/2008 |
| JP | 2010501118 A | 1/2010 |
| JP | 2010-098098 A | 4/2010 |
| KR | 2001-0002214 A | 1/2001 |
| KR | 20010081922 A | 8/2001 |
| KR | 2001-0094894 A | 11/2001 |
| KR | 10-0382035 B1 | 5/2003 |
| KR | 10-0393095 B1 | 7/2003 |
| KR | 2005-0119414 A | 12/2005 |
| KR | 2006-0120365 A | 11/2006 |
| KR | 10-0690247 B1 | 2/2007 |
| KR | 1020060004298 | 3/2007 |
| KR | 2007-0088177 A | 8/2007 |
| KR | 2009-0008341 A | 1/2009 |
| KR | 2009-0086314 A | 8/2009 |
| KR | 2010-0041430 A | 4/2010 |
| KR | 101011863 B1 | 1/2011 |

(56) References Cited

FOREIGN PATENT DOCUMENTS

| KR | 101061531 B1 | 9/2011 |
|---|---|---|
| TW | I301314 B | 9/2008 |
| TW | I313049 B | 8/2009 |
| TW | 201239998 | 10/2012 |
| WO | 9812568 | 3/1998 |
| WO | 2007088757 A1 | 8/2007 |

OTHER PUBLICATIONS

Taiwanese Office Action for Application No. 102138051 dated Apr. 7, 2015.
Asinash Roy et al: "Effects of Coupling Capacitance and Inductance on Delay Uncertainty and Clock Skew", 2007 44th ACM/IEEE Design Automation Conference, San Diego, CA, Jun. 4-8, 2007, IEEE, Piscataway, NJ, Jun. 1, 2007, pp. 184-187, XP031183328.
International Search Report and Written Opinion for application No. PCT/US2012/029873 dated Jun. 4, 2012.
International Search Report and Written Opinion for Application No. PCT/US2012/029876 dated Aug. 17, 2012.
International Search Report and Written Opinion for Application No. PCT/US2012/032997 dated Aug. 7, 2012.
International Search Report and Written Opinion for Application No. PCT/US2012/071630 dated Apr. 4, 2013.
International Search Report and Written Opinion for Application No. PCT/US2013/053240 dated Sep. 16, 2013.
International Search Report and Written Opinion for Application No. PCT/US2013/065605 dated Feb. 21, 2014.
International Search Report and Written Opinion for PCT/US2012/034196 dated Jun. 4, 2012.
International Search Report Application No. PCT/US2011/031391, dated Dec. 12, 2011.
International Search Report for Application No. PCT/US2011/056352 dated Apr. 5, 2012.
Korean Application No. 10-2011-0041843, dated May, 3, 2011 (English translation of Spec and drawings).
Korean Search Report from U.S. Appl. No. 61/477,820, dated Sep. 6, 2011.
Korean Search Report from U.S. Appl. No. 61/477,877, dated Sep. 6, 2011.
Korean Search Report from U.S. Appl. No. 61/477,883, dated Sep. 6, 2011.
Korean Search Report from U.S. Appl. No. 61/477,967, dated Sep. 6, 2011.
Office Action from Korean Patent Application No. 10-2010-0129888 dated Jan. 18, 2011.
Office Action from Korean Patent Application No. 10-2010-0129890 dated Jan. 18, 2011.
Partial International Search Report Application No. PCT/US2011/031391, dated Aug. 25, 2011.
Partial International Search Report for Application No. PCT/US2012/032997 dated Jun. 27, 2012.
Partial Search Report for Application No. PCT/US2013/065605 dated Nov. 28, 2013.
Search Report from Korean Patent Application No. 10-2010-0129888 dated Jan. 18, 2011.
Search Report from Korean Patent Application No. 10-2010-0129890 dated Jan. 18, 2011.
Taiwanese Office Action for Application No. 101112514 dated Mar. 13, 2014.
U.S. Appl. No. 61/477,877, filed Apr. 21, 2011.
Written Opinion of the International Preliminary Examining Authority dated Apr. 16, 2013 for Application No. PCT/US2012/029876.
European Examination Report for Application No. 11776969.5 dated Jun. 27, 2014.
International Preliminary Report on Patentability for Application No. PCT/US2011/056352 dated Apr. 23, 2013.
Second Written Opinion for Application No. PCT/US2013/053240 dated Jul. 29, 2014.
Taiwanese Office Action for Application No. 101112511 dated Sep. 30, 2014.
Japanese Office Action for Application No. 2104-506416 dated Jun. 19, 2015.
Japanese Office Action for Application No. 2014-506417 dated Aug. 4, 2015.
Non-Final Rejection mailed Nov. 19, 2012 in U.S. Appl. No. 12/907,522.
Amendment Filed Mar. 19, 2013 in Response to Non-Final Rejection mailed Nov. 19, 2012 in U.S. Appl. No. 12/907,522.
Final Rejection mailed May 8, 2013 in U.S. Appl. No. 12/907,522.
Amendment Filed May 24, 2013 in Response to Final Rejection mailed May 8, 2013 in U.S. Appl. No. 12/907,522.
Non-Final Rejection mailed Jan. 9, 2014 in U.S. Appl. No. 14/046,233.
Amendment Filed Apr. 9, 2014 in Response to Non-Final Rejection mailed Jan. 9, 2014 in U.S. Appl. No. 14/046,233.
Final Rejection mailed Jun. 20, 2014 in U.S. Appl. No. 14/046,233.
Amendment Filed Aug. 19, 2014 in Response to Final Rejection mailed Jun. 20, 2014 in U.S. Appl. No. 14/046,233.

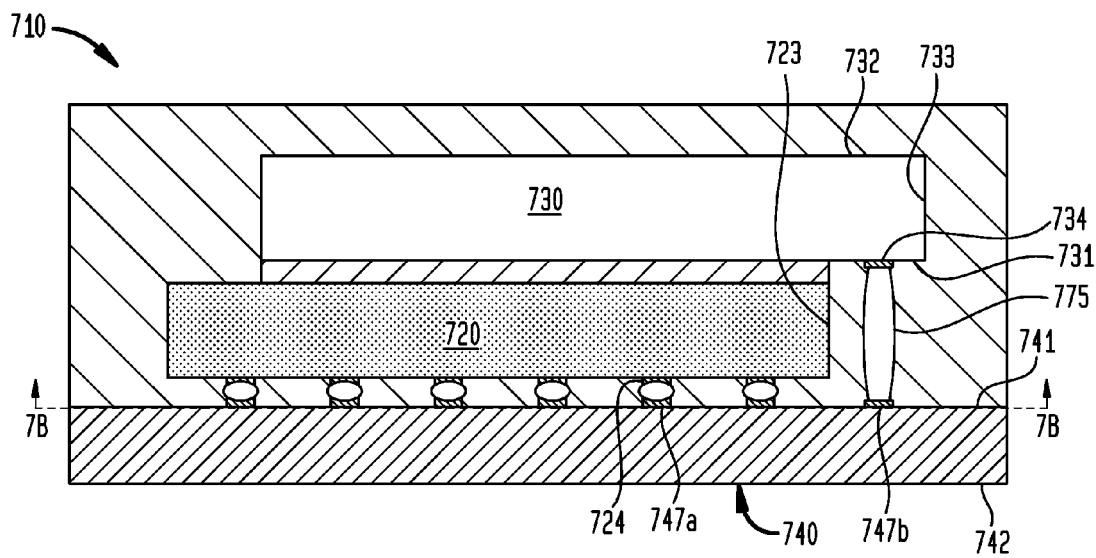
FIG. 7A
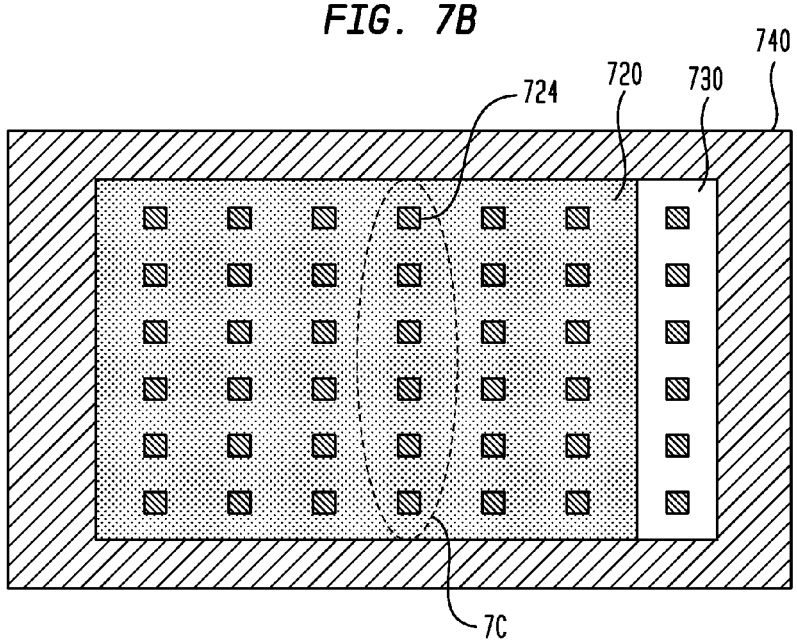
FIG. 7B
FIG. 7C

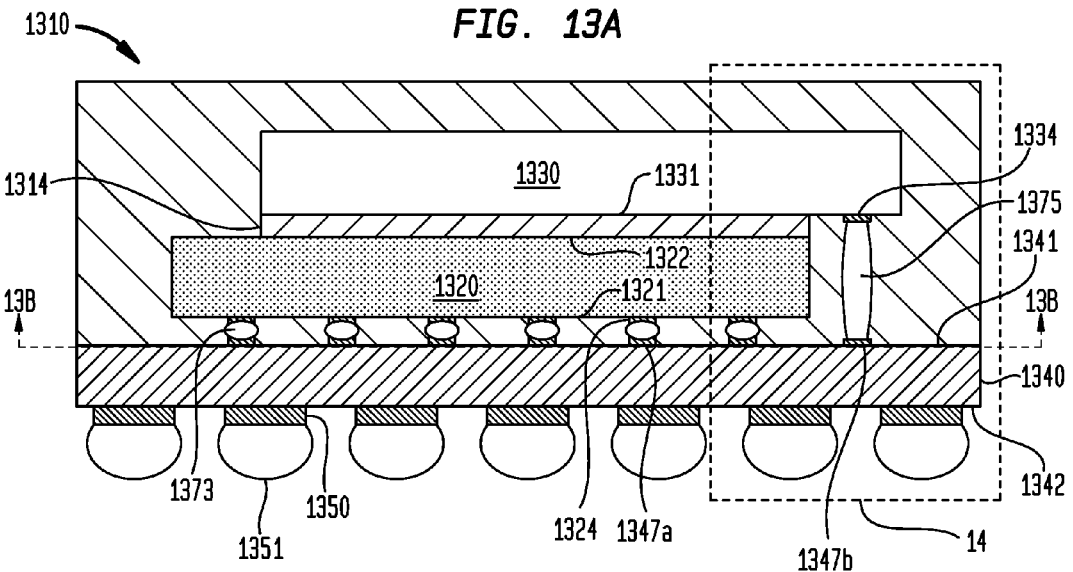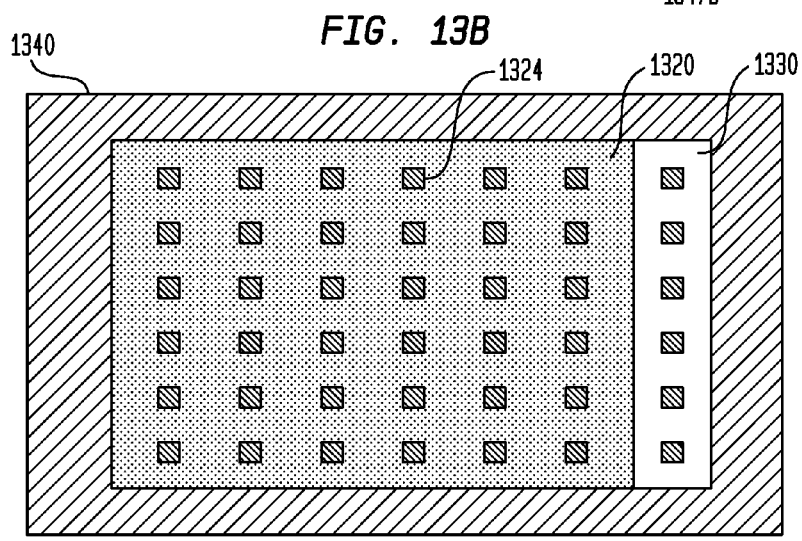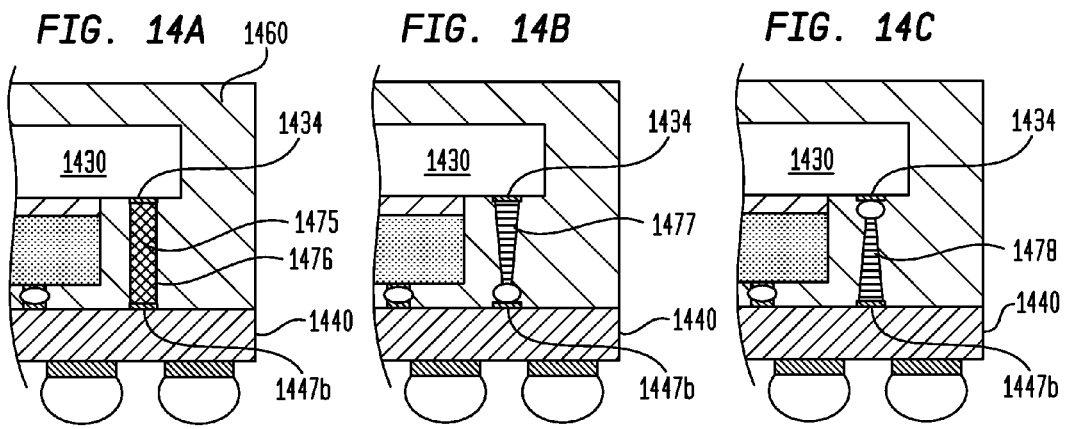

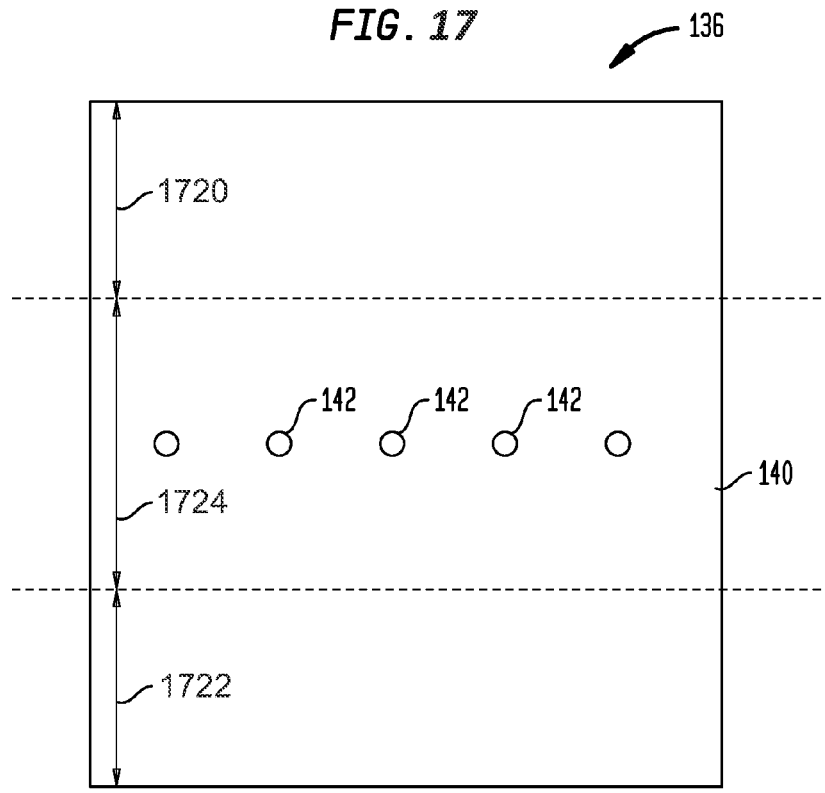
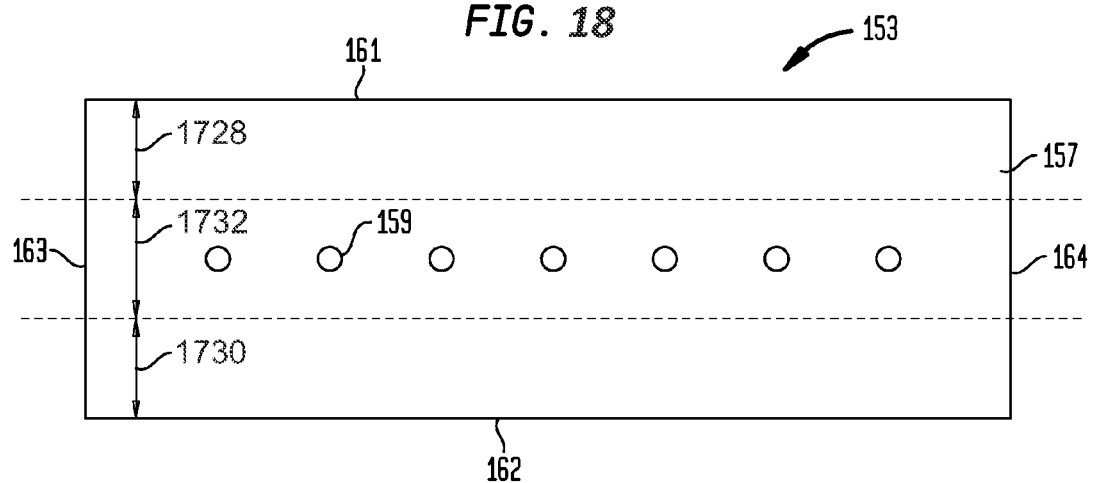

MULTIPLE DIE STACKING FOR TWO OR MORE DIE

CROSS-REFERENCE TO RELATED APPLICATIONS

The present application is a continuation of U.S. patent application Ser. No. 13/658,401, filed Oct. 23, 2012, now U.S. Pat. No. 8,952,516, which is a continuation-in-part of U.S. patent application Ser. No. 13/306,203, filed Nov. 29, 2011, now U.S. Pat. No. 8,633,576, which claims the benefit of the filing date of U.S. Provisional Patent Application Ser. No. 61/477,820, filed Apr. 21, 2011, the disclosures of which are hereby incorporated by reference herein. The following commonly-owned applications are hereby incorporated by reference herein: U.S. Provisional Patent Application Ser. Nos. 61/477,877, 61/477,883, and 61/477,967, all filed Apr. 21, 2011.

BACKGROUND OF THE INVENTION

The present invention relates to stacked microelectronic assemblies and methods of making such assemblies, and to components useful in such assemblies.

Semiconductor chips are commonly provided as individual, prepackaged units. A standard chip has a flat, rectangular body with a large front face having contacts connected to the internal circuitry of the chip. Each individual chip typically is mounted in a package which, in turn, is mounted on a circuit panel such as a printed circuit board and which connects the contacts of the chip to conductors of the circuit panel. In many conventional designs, the chip package occupies an area of the circuit panel considerably larger than the area of the chip itself.

As used in this disclosure with reference to a flat chip having a front face, the "area of the chip" should be understood as referring to the area of the front face. In "flip chip" designs, the front face of the chip confronts the face of a package substrate, i.e., the chip carrier, and the contacts on the chip are bonded directly to contacts of the chip carrier by solder balls or other connecting elements. In turn, the chip carrier can be bonded to a circuit panel through terminals overlying the front face of the chip. The "flip chip" design provides a relatively compact arrangement; each chip occupies an area of the circuit panel equal to or slightly larger than the area of the chip's front face, such as disclosed, for example, in certain embodiments of commonly-assigned U.S. Pat. Nos. 5,148,265; 5,148,266; and 5,679,977, the disclosures of which are incorporated herein by reference.

Certain innovative mounting techniques offer compactness approaching or equal to that of conventional flip-chip bonding. Packages which can accommodate a single chip in an area of the circuit panel equal to or slightly larger than the area of the chip itself are commonly referred to as "chip-sized packages."

Besides minimizing the planar area of the circuit panel occupied by microelectronic assembly, it is also desirable to produce a chip package that presents a low overall height or dimension perpendicular to the plane of the circuit panel. Such thin microelectronic packages allow for placement of a circuit panel having the packages mounted therein in close proximity to neighboring structures, thus reducing the overall size of the product incorporating the circuit panel.

Various proposals have been advanced for providing plural chips in a single package or module. In the conventional "multi-chip module," the chips are mounted side-by-side on a single package substrate, which in turn can be mounted to the circuit panel. This approach offers only limited reduction in the aggregate area of the circuit panel occupied by the chips. The aggregate area is still greater than the total surface area of the individual chips in the module.

It has also been proposed to package plural chips in a "stack" arrangement, i.e., an arrangement where plural chips are placed one on top of another. In a stacked arrangement, several chips can be mounted in an area of the circuit panel that is less than the total area of the chips. Certain stacked chip arrangements are disclosed, for example, in certain embodiments of the aforementioned U.S. Pat. Nos. 5,679,977; 5,148,265; and U.S. Pat. No. 5,347,159, the disclosure of which is incorporated herein by reference. U.S. Pat. No. 4,941,033, also incorporated herein by reference, discloses an arrangement in which chips are stacked on top of another and interconnected with one another by conductors on so-called "wiring films" associated with the chips.

Despite the advances that have been made in multi-chip packages, there is still a need for improvements in order to minimize the size and improve the performance of such packages. These attributes of the present invention are achieved by the construction of the microelectronic assemblies as described hereinafter.

BRIEF SUMMARY OF THE INVENTION

In accordance with an aspect of the invention, a microelectronic package can include a substrate having first and second opposed surfaces, and first and second microelectronic elements having front surfaces facing the first surface of the substrate. The substrate can have a plurality of substrate contacts at the first surface and a plurality of terminals at the second surface configured for connecting the microelectronic package to at least one component external to the package. Each microelectronic element can have a plurality of element contacts at the front surface thereof. The element contacts of each microelectronic element can be joined with corresponding ones of the substrate contacts. The front surface of the second microelectronic element can partially overlie a rear surface of the first microelectronic element and can be attached thereto. The element contacts of the first microelectronic element can be arranged in an area array and are flip-chip bonded with a first set of the substrate contacts. The element contacts of the second microelectronic element can be joined with a second set of the substrate contacts by conductive masses.

In a particular example, the element contacts of the second microelectronic element can project beyond a lateral edge of the first microelectronic element. In one embodiment, at least one of the first and second microelectronic elements can include a memory storage element. In an exemplary embodiment, the microelectronic package can also include a plurality of leads extending from at least some of the substrate contacts to the terminals. The leads can be usable to carry an address signal usable to address the memory storage element in at least one of the first and second microelectronic elements. In one example, at least some of the terminals can be usable to carry at least one of a signal or a reference potential between the respective terminals and each of the first and second microelectronic elements.

In one embodiment, the microelectronic package can also include a plurality of third microelectronic elements, each third microelectronic element being electrically connected to the substrate. In a particular example, the plurality of third microelectronic elements can be arranged in a stacked configuration, each of the third microelectronic elements having a front or rear surface confronting a front or rear surface of an adjacent one of the third microelectronic elements. In one embodiment, the plurality of third microelectronic elements can be arranged in a planar configuration, each of the third microelectronic elements having a peripheral surface confronting a peripheral surface of an adjacent one of the third microelectronic elements.

In an exemplary embodiment, the second microelectronic element can include volatile RAM, the third microelectronic elements can each include nonvolatile flash memory, and the first microelectronic element can include a processor configured to predominantly control transfers of data between an external component and the second and third microelectronic elements. In one example, the second microelectronic element can include a volatile frame buffer memory storage element, the third microelectronic elements can each include nonvolatile flash memory, and the first microelectronic element can include a graphics processor.

In a particular embodiment, a system can include a plurality of microelectronic packages as described above, a circuit panel, and a processor. The terminals of the microelectronic packages can be electrically connected with panel contacts of the circuit panel. Each microelectronic package can be configured to transfer a number N of data bits in parallel in a clock cycle. The processor can be configured to transfer a number M of data bits in parallel in a clock cycle, M being greater than or equal to N. In a particular example, a system can include a microelectronic package as described above and one or more other electronic components electrically connected to the microelectronic package. In one embodiment, the system can also include a housing, said microelectronic package and said other electronic components being mounted to said housing.

In accordance with another aspect of the invention, a module can include a module card having first and second surfaces, and first and second microelectronic elements having front surfaces facing the first surface of the module card. The module card can have a plurality of parallel exposed edge contacts adjacent an edge of at least one of the first and second surfaces for mating with corresponding contacts of a socket when the module is inserted in the socket. The module card can have a plurality of card contacts at the first surface. Each microelectronic element can have a plurality of element contacts at the front surface thereof. The element contacts of each microelectronic element can be joined with corresponding ones of the card contacts. The front surface of the second microelectronic element can partially overlie a rear surface of the first microelectronic element and can be attached thereto. The element contacts of the first microelectronic element can be arranged in an area array and can be flip-chip bonded with a first set of the card contacts. The element contacts of the second microelectronic element can be joined with a second set of the card contacts by conductive masses.

In an exemplary embodiment, the element contacts of the second microelectronic element can project beyond a lateral edge of the first microelectronic element. In one example, the edge contacts can be exposed at at least one of the first or second surfaces of the module card. In a particular embodiment, at least one of the first and second microelectronic elements can include a memory storage element. In one embodiment, the module can also include a plurality of leads extending from at least some of the card contacts to the edge contacts. The leads can be usable to carry an address signal usable to address the memory storage element in at least one of the first and second microelectronic elements. In a particular example, at least some of the edge contacts can be usable to carry at least one of a signal or a reference potential between the respective edge contact and each of the first and second microelectronic elements.

In a particular example, the module can also include a plurality of third microelectronic elements, each third microelectronic element being electrically connected to the module card. In one example, the plurality of third microelectronic elements can be arranged in a stacked configuration, each of the third microelectronic elements having a front or rear surface confronting a front or rear surface of an adjacent one of the third microelectronic elements. In a particular embodiment, the plurality of third microelectronic elements can be arranged in a planar configuration, each of the third microelectronic elements having a peripheral surface confronting a peripheral surface of an adjacent one of the third microelectronic elements.

In one embodiment, the second microelectronic element can include volatile RAM, the third microelectronic elements can each include nonvolatile flash memory, and the first microelectronic element can include a processor configured to predominantly control transfers of data between an external component and the second and third microelectronic elements. In a particular example, the second microelectronic element can include a volatile frame buffer memory storage element, the third microelectronic elements can each include nonvolatile flash memory, and the first microelectronic element can include a graphics processor.

In an exemplary embodiment, a system can include a plurality of modules as described above, a circuit panel, and a processor. The exposed contacts of the modules can be inserted into a mating socket electrically connected with the circuit panel. Each module can be configured to transfer a number N of data bits in parallel in a clock cycle. The processor can be configured to transfer a number M of data bits in parallel in a clock cycle, M being greater than or equal to N. In one example, a system can include a module as described above and one or more other electronic components electrically connected to the module. In a particular embodiment, the system can also include a housing, said module and said other electronic components being mounted to said housing.

BRIEF DESCRIPTION OF THE DRAWINGS

FIG. 7A is a diagrammatic sectional view of a stacked microelectronic assembly according to another embodiment having a microelectronic element with contacts located near an edge thereof.

FIG. 7B is a bottom sectional view of the stacked package of FIG. 7A, taken along the line 7B-7B of FIG. 7A.

FIG. 7C is a fragmentary view showing an alternate arrangement of contacts for a portion of FIG. 7B.

FIG. 13A is a diagrammatic sectional view of a stacked microelectronic package according to another embodiment.

FIG. 13B is a bottom sectional view of the stacked package of FIG. 1A, taken along the line 13B-13B of FIG. 13A.

FIGS. 14A-14E are fragmentary sectional views of variations of a portion of the stacked microelectronic package of FIG. 13A indicated by the dashed area 14 of FIG. 13A.

FIG. 17 is a bottom plan view of a microelectronic element in the embodiment of FIG. 6 or FIG. 15.

FIG. 18 is a bottom plan view of another microelectronic element in the embodiment of FIG. 6 or FIG. 15.

DETAILED DESCRIPTION

Figure 1A:
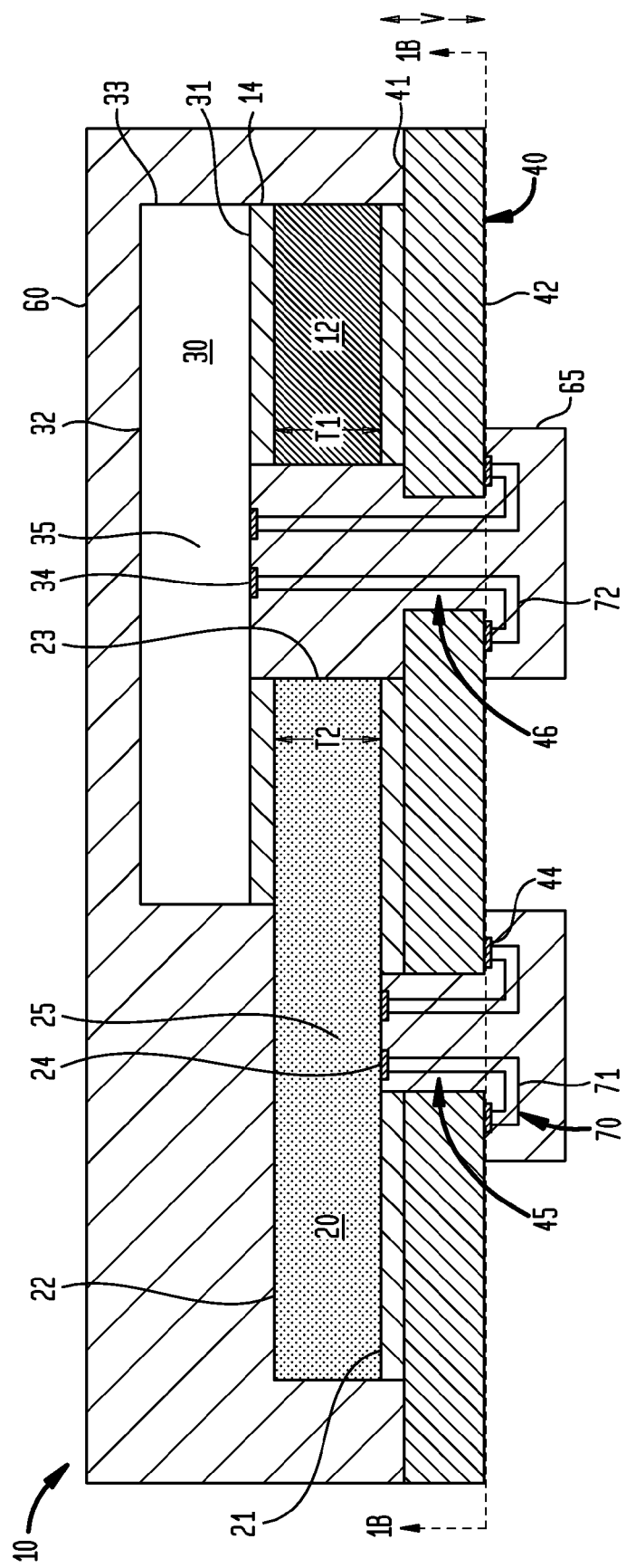
FIG. 1A is a diagrammatic sectional view of a stacked microelectronic assembly according to an embodiment of the present invention.
Figure 1B:
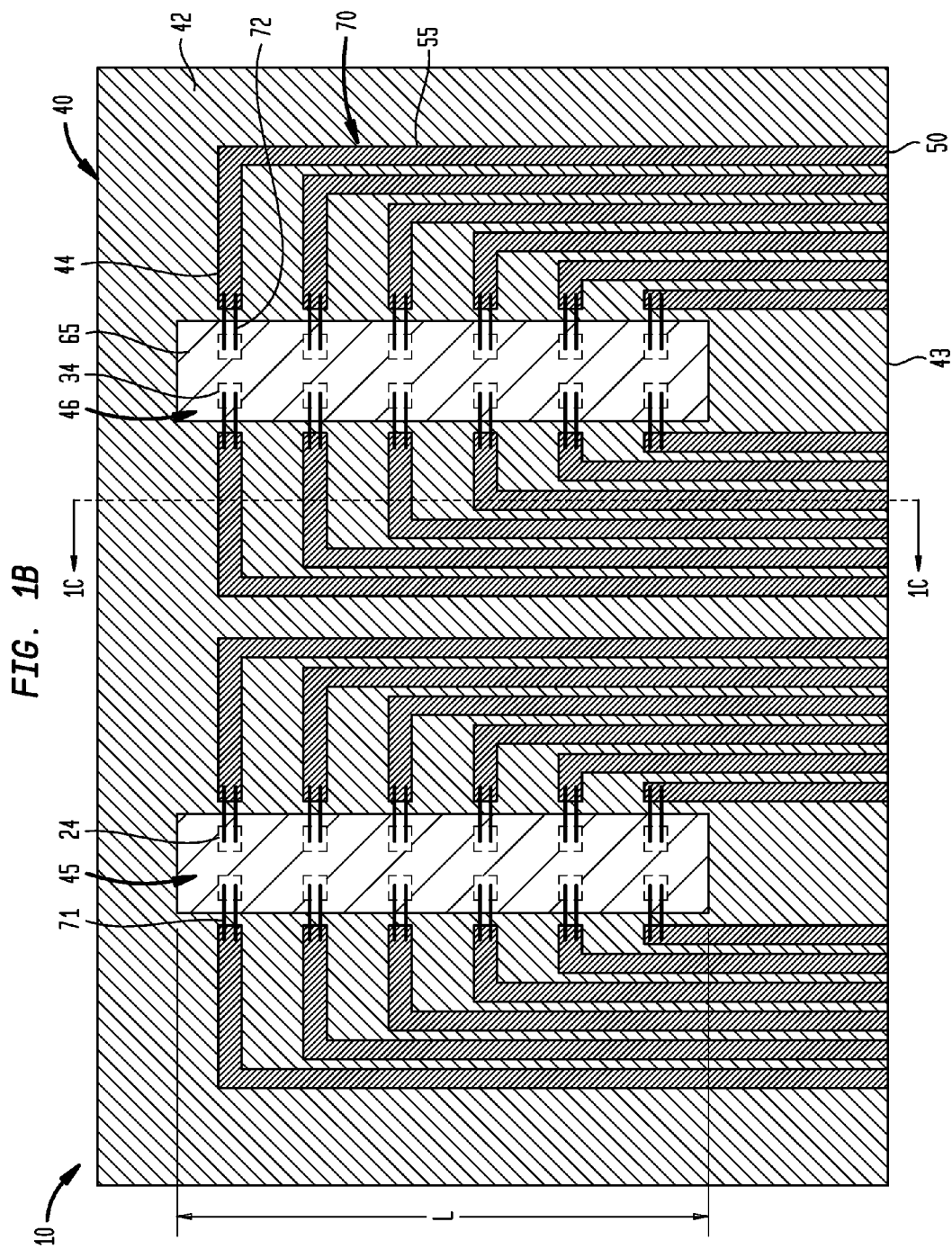
FIG. 1B is a bottom sectional view of the stacked assembly of FIG. 1A, taken along the line 1B-1B of FIG. 1A.
Figure 1C:
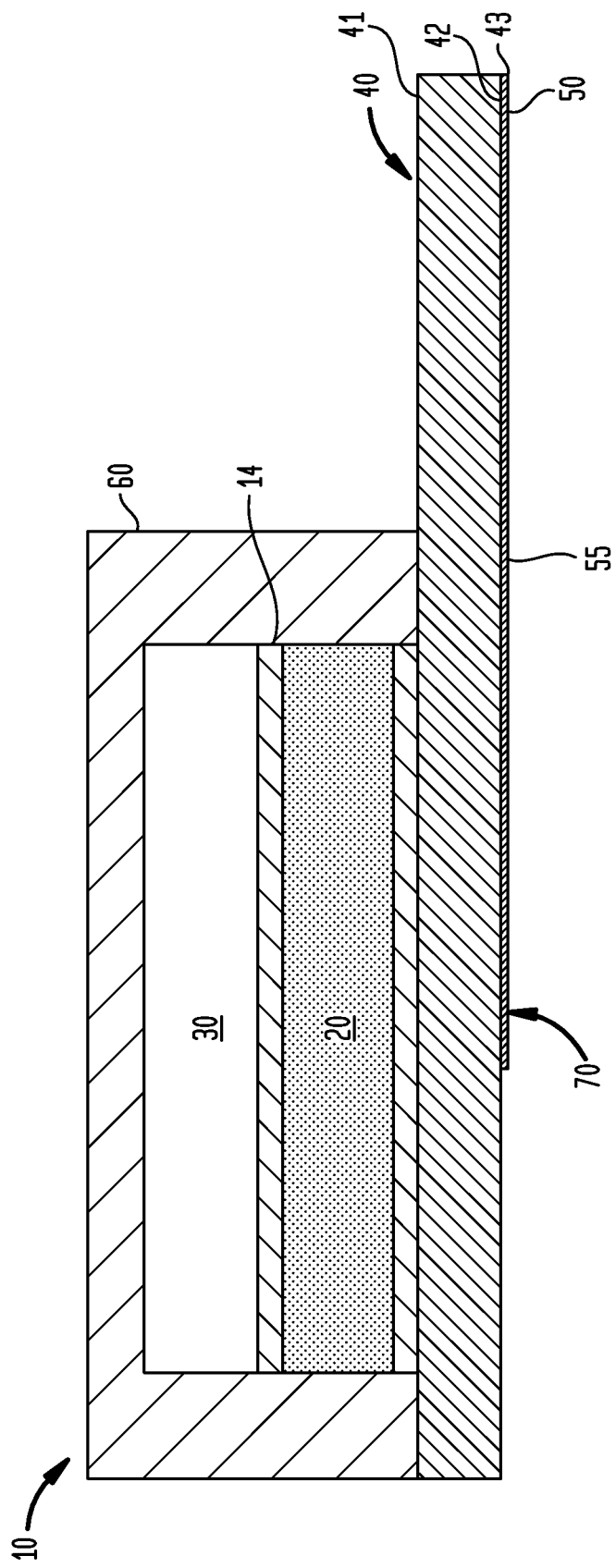
FIG. 1C is a side sectional view of the stacked assembly of FIG. 1B, taken along the line 1C-1C of FIG. 1B.

With reference to FIGS. 1A through 1C, a module 10 according to an embodiment of the present invention can include a first microelectronic element 20, a second microelectronic element 30, and a module card 40 having exposed edge contacts 50. A first encapsulant 60 can cover the microelectronic elements 20 and 30 and a portion of the module card 40.

In some embodiments, at least one of the first and second microelectronic elements 20 and 30 can be a semiconductor chip, a wafer, or the like. For example, one or both of the first microelectronic element 20 and the second microelectronic element 30 can include a memory storage element such as a DRAM. As used herein, a "memory storage element" refers to a multiplicity of memory cells arranged in an array, together with circuitry usable to store and retrieve data therefrom, such as for transport of the data over an electrical interface. In a particular example, the module 10 can be included in a single in-line memory module ("SIMM") or a dual in-line memory module ("DIMM").

The first microelectronic element 20 can have a front surface 21, a rear surface 22 remote therefrom, and lateral edges 23 extending between the front and rear surfaces. Electrical contacts 24 are exposed at the front surface 21 of the first microelectronic element 20. As described herein, the electrical contacts 24 of the first microelectronic element 20 can also be referred to as "chip contacts." As used in this disclosure, a statement that an electrically conductive element is "exposed at" a surface of a structure indicates that the electrically conductive element is available for contact with a theoretical point moving in a direction perpendicular to the surface toward the surface from outside the structure. Thus, a terminal or other conductive element which is exposed at a surface of a structure can project from such surface; can be flush with such surface; or can be recessed relative to such surface and exposed through a hole or depression in the structure. The contacts 24 of the first microelectronic element 20 are exposed at the front surface 21 within a central region 25 of the first microelectronic element. For example, the contacts 24 can be arranged in one or two parallel rows adjacent the center of the front surface 21.

The second microelectronic element 30 can have a front surface 31, a rear surface 32 remote therefrom, and lateral edges 33 extending between the front and rear surfaces. Electrical contacts 34 are exposed at the front surface 31 of the second microelectronic element 30. As described herein, the electrical contacts 34 of the second microelectronic element 30 can also be referred to as "chip contacts." The contacts 34 of the second microelectronic element 30 are exposed at the front surface 31 within a central region 35 of the second microelectronic element. For example, the contacts 34 can be arranged in one or two parallel rows adjacent the center of the front surface 31.

As seen in FIGS. 1A and 1C, the first and second microelectronic elements 20 and 30 can be stacked relative to one another. In some embodiments, the front surface 31 of the second microelectronic element 30 and the rear surface 22 of the first microelectronic element 20 can face one another. At least a portion of the front surface 31 of the second microelectronic element 30 can overlie at least a portion of the rear surface 22 of the first microelectronic element 20. At least a portion of the central region 35 of the second microelectronic element 30 can project beyond a lateral edge 23 of the first microelectronic element 20. Accordingly, the contacts 34 of the second microelectronic element 30 can be positioned in a location projecting beyond the lateral edge 23 of the first microelectronic element 20.

The microelectronic assembly 10 can further include a module card 40 having oppositely-facing first and second surfaces 41 and 42. One or more electrically conductive contacts 44 can be exposed at the second surface 42 of the module card 40. The module card 40 can further include one or more apertures such as the first aperture 45 and the second aperture 46. As shown in FIGS. 1A and 1C, the front surfaces 21, 31 of the respective first and second microelectronic elements 20, 30 can face the first surface 41 of the module card 40.

The module card 40 can be partly or entirely made of any suitable dielectric material. For example, the module card 40 may comprise a relatively rigid, board-like material such as a thick layer of fiber-reinforced epoxy, such as Fr-4 or Fr-5 board. Regardless of the material employed, the module card 40 may include a single layer or multiple layers of dielectric material. In a particular embodiment, the module card 40 can consist essentially of a material having a coefficient of thermal expansion ("CTE") of less than 30 ppm/° C.

As seen in FIG. 1, the module card 40 may extend beyond a lateral edge 23 of the first microelectronic element 20 and a lateral edge 33 of the second microelectronic element 30. The first surface 41 of the module card 40 may be juxtaposed with the front surface 21 of the first microelectronic element 20.

In the embodiment depicted in FIGS. 1A through 1C, the module card 40 includes a first aperture 45 substantially aligned with the central region 25 of the first microelectronic element 20 and a second aperture 46 substantially aligned with the central region 35 of the second microelectronic element 30, thereby providing access to contacts 24 and 34 through the respective first and second apertures. The first and second apertures 45 and 46 can extend between the first and second surfaces 41 and 42 of the module card 40. As shown in FIG. 1B, the apertures 45 and 46 can be aligned with the corresponding chip contacts 24 or 34 of the respective first and second microelectronic elements 20 and 30.

The module card 40 may also include electrically conductive contacts 44 exposed at the second surface 42 thereof and electrically conductive traces 55 extending between the contacts 44 and the exposed edge contacts 50. The electrically conductive traces 55 electrically couple the contacts 44 to the exposed edge contacts 50. In a particular embodiment, the contacts 44 can be end portions of respective ones of the traces 55.

In a particular embodiment, the module card 40 can have a plurality of parallel exposed edge contacts 50 adjacent an insertion edge 43 of at least one of the first and second surfaces 41, 42 for mating with corresponding contacts of a socket (shown in FIG. 12) when the module 10 is inserted in the socket. As shown in FIG. 1B, the insertion edge 43 can be located such that each of the apertures 45 and 46 have a long dimension L extending in a direction away from the insertion edge of the module card 40. Some or all of the edge contacts 50 can be exposed at either or both of the first or second surfaces 41, 42 of the module card 40.

The exposed edge contacts 50 and the insertion edge 43 can be sized for insertion into a corresponding socket (FIG. 12) of other connector of a system, such as can be provided on a motherboard. Such exposed edge contacts 50 can be suitable for mating with a plurality of corresponding spring contacts (FIG. 12) within such socket connector. Such spring contacts can be disposed on single or multiple sides of each slot to mate with corresponding ones of the exposed edge contacts 50. In one example, at least some of the edge contacts 50 can be usable to carry at least one of a signal or a reference potential between the respective edge contact and each of the first and second microelectronic elements 20, 30.

As seen in FIGS. 1A through 1C, electrical connections or leads 70 can electrically connect the contacts 24 of the first microelectronic element 20 and the contacts 34 of the second microelectronic element 30 to the exposed edge contacts 50. The leads 70 may include wire bonds 71 and 72 and the conductive traces 55. In one embodiment, the leads 70 can be considered to electrically connect each microelectronic element 20, 30 to the module card 40. In a particular example, the leads 70 can be usable to carry an address signal usable to address a memory storage element in at least one of the first and second microelectronic elements 20, 30.

As used herein, a "lead" is a portion of or the entire electrical connection extending between two electrically conductive elements, such as the lead 70 comprising wire bonds 71 and a conductive trace 55 that extends from one of the contacts 24 of the first microelectronic element 20, through the first aperture 45, to one of the exposed edge contacts 50.

In one example, the module 10 can include a plurality of leads 70 extending within the apertures 45 and 46 from chip contacts 24 and 34 of at least one of the first and second microelectronic elements 20 and 30 to the exposed edge contacts 50. In a particular embodiment, the leads 70 can include the conductive traces 55 on the module card 40 and the wire bonds 71, 72 extending from the conductive traces to the chip contacts 24, 34 of at least one of the first and second microelectronic elements 20, 30.

As shown in FIG. 1B, the conductive traces 55 of the leads 70 can extend along the second surface 42 of the module card 40. In a particular example, the conductive traces 55 of the leads 70 can extend along the first surface 41 of the module card 40, or the conductive traces of the leads can extend along both the first and second surfaces 41, 42 of the module card. Portions of the conductive traces 55 can extend along a surface 41 or 42 of the module card 40 in a direction approximately parallel to the long dimensions L of the apertures 45 and 46 from the respective contacts 24 and 34 to the exposed edge contacts 50. In a particular embodiment, the conductive traces 55 be arranged in a pattern along a surface 41 or 42 of the module card 40 such that the length of the leads 70 between the respective contacts 24 and 34 and the exposed edge contacts 50 can be minimized.

Each of the wire bonds 71 and 72 can extend through the respective first or second aperture 45 or 46 and can electrically couple a contact respective 24 or 34 to a corresponding contact 44 of the module card 40. The process of forming the wire bonds 71 and 72 can include inserting a bonding tool through the apertures 45, 46 to electrically connect the conductive contacts 24, 34 to corresponding conductive contacts 44 of the module card 40.

In a particular embodiment, each of the wire bonds 71 and 72 can be a multiple wire bond including a plurality of wire bonds oriented substantially parallel to one another. Such a multiple wire bond structure including a plurality of wire bonds 71 or 72 can provide electrically parallel conductive paths between a contact 24 or 34 and a corresponding contact 44 of the module card 40.

A spacer 12 can be positioned between the front surface 31 of the second microelectronic element 30 and a portion of the first surface 41 of the module card 40. Such a spacer 12 can be made, for example, from a dielectric material such as silicon dioxide, a semiconductor material such as silicon, or one or more layers of adhesive. If the spacer 12 includes adhesives, the adhesives can connect the second microelectronic element 30 to the module card 40. In one embodiment, the spacer 12 can have substantially the same thickness T1 in a vertical direction V substantially perpendicular to the first surface 41 of the module card 40 as the thickness T2 of the first microelectronic element 20 between the front and rear surfaces 21, 22 thereof.

In a particular embodiment, the spacer 12 can be replaced by a buffering chip having a surface facing the first surface 41 of the module card 40. In one example, such a buffering chip can be flip-chip bonded to contacts exposed at the first surface 41 of the module card 40. Such a buffering chip can be configured to help provide impedance isolation for each of the microelectronic elements 20 and 30 with respect to components external to the module 10.

One or more adhesive layers 14 can be positioned between the first microelectronic element 20 and the module card 40, between the first and second microelectronic elements 20 and 30, between the second microelectronic element 30 and the spacer 12, and between the spacer 12 and the module card 40. Such adhesive layers 14 can include adhesive for bonding the aforementioned components of the module 10 to one another. In a particular embodiment, the one or more adhesive layers 14 can extend between the first surface 41 of the module card 40 and the front surface 21 of the first microelectronic element 20. In one embodiment, the one or more adhesive layers 14 can attach at least a portion of the front surface 31 of the second microelectronic element 30 to at least a portion of the rear surface 22 of the first microelectronic element 20.

In one example, each adhesive layer 14 can be partly or entirely made of a die attachment adhesive and can be comprised of a low elastic modulus material such as silicone elastomer. In one embodiment, the die attachment adhesive can be compliant. In another example, each adhesive layer 14 can be entirely or partly made of a thin layer of high elastic modulus adhesive or solder if the two microelectronic elements 20 and 30 are conventional semiconductor chips formed of the same material, because the microelectronic elements will tend to expand and contract in unison in response to temperature changes. Regardless of the materials employed, each of the adhesive layers 14 can include a single layer or multiple layers therein. In a particular embodiment where the spacer 12 is made from an adhesive, the adhesive layers 14 positioned between the spacer 12 and the second microelectronic element 30 and the module card 40 can be omitted.

The module 10 can also include a first encapsulant 60 and a second encapsulant 65. The first encapsulant 60 can cover, for example, the rear surfaces 22 and 32 of the respective first and second microelectronic elements 20 and 30 and a portion of the first surface 41 of the module card 40. In a particular embodiment, the first encapsulant 60 can be an overmold. One or more second encapsulants 65 can cover portions of the front surfaces 21 and 31 of the respective microelectronic elements 20 and 30 exposed within the respective apertures 45 and 46, a portion of the second surface 42 of the module card 40, the contacts 24, 34, and 44, and the wire bonds 71 and 72 extending between the respective contacts 24 and 34 and the corresponding contacts 44. In a particular embodiment, a second encapsulant 65 can cover portions of the leads 70 extending between the chip contacts 24 and 34 and the module card 40.

In a process according to a particular embodiment, the first encapsulant 60 can be injected onto the rear surfaces 22 and 32 of the respective first and second microelectronic elements 20 and 30 and onto the first surface 41 of the module card 40. In a process according to one example, the second encapsulant 65 can be injected into the first and second apertures 45, 46 such that portions of the leads 70 between the chip contacts 24, 34 and the module card 40 are covered by the second encapsulant.

Figure 2:
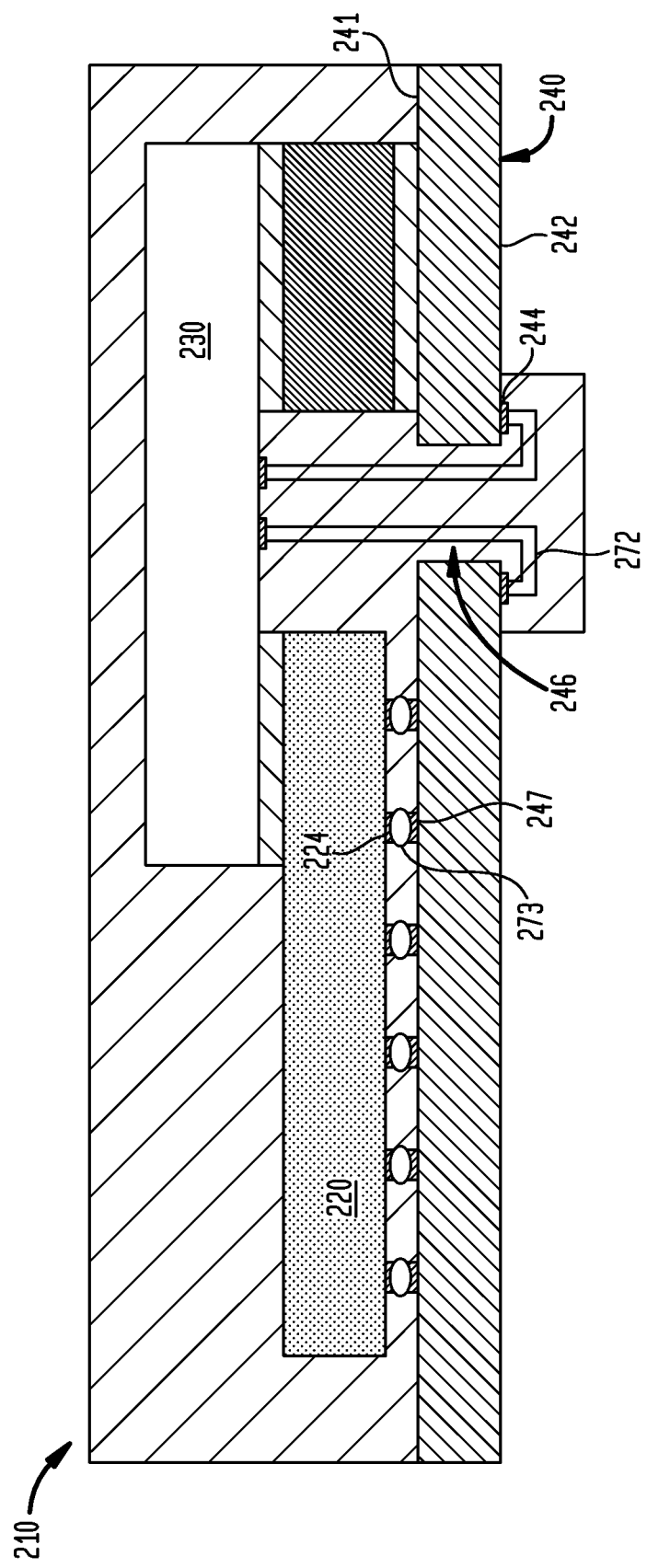
FIG. 2 is a diagrammatic sectional view of a stacked microelectronic assembly according to another embodiment having a flip-chip bonded microelectronic element.

FIG. 2 shows a variation of the embodiment described above with respect to FIGS. 1A through 1C. In this variation, a module 210 is the same as the module 10 described above, except that the first microelectronic element 220 is flip-chip bonded to the first surface 241 of the module card 240, rather than being wire-bonded to the second surface of the module card.

Conductive contacts 224 are exposed at the front surface 221 of the first microelectronic element 220. The conductive contacts or chip contacts 224 can be electrically connected to conductive contacts 247 exposed at the first surface 241 of the module card 240, for example, by conductive masses 273. The conductive masses 273 can comprise a fusible metal having a relatively low melting temperature, e.g., solder, tin, or a eutectic mixture including a plurality of metals. Alternatively, the conductive masses 273 can include a wettable metal, e.g., copper or other noble metal or non-noble metal having a melting temperature higher than that of solder or another fusible metal. In a particular embodiment, the conductive masses 273 can include a conductive material interspersed in a medium, e.g., a conductive paste, e.g., metal-filled paste, solder-filled paste or isotropic conductive adhesive or anisotropic conductive adhesive.

Conductive traces (not shown in FIG. 2) can extend from the conductive contacts 247 along the first surface 241 of the module card 240 to exposed edge contacts at an insertion edge of the module card such as the insertion edge 43 shown in FIGS. 1B and 1C. As in the module 10 described above, chip contacts 234 of the second microelectronic element 230 can be electrically connected to corresponding conductive contacts 244 of the module card 240 by wire bonds 272 extending through an aperture 246 of the module card. Conductive traces can also extend from the conductive contacts 244 along the second surface 242 of the module card 240 to exposed edge contacts at an insertion edge of the module card such as the insertion edge 43 shown in FIGS. 1B and 1C.

Figure 3:
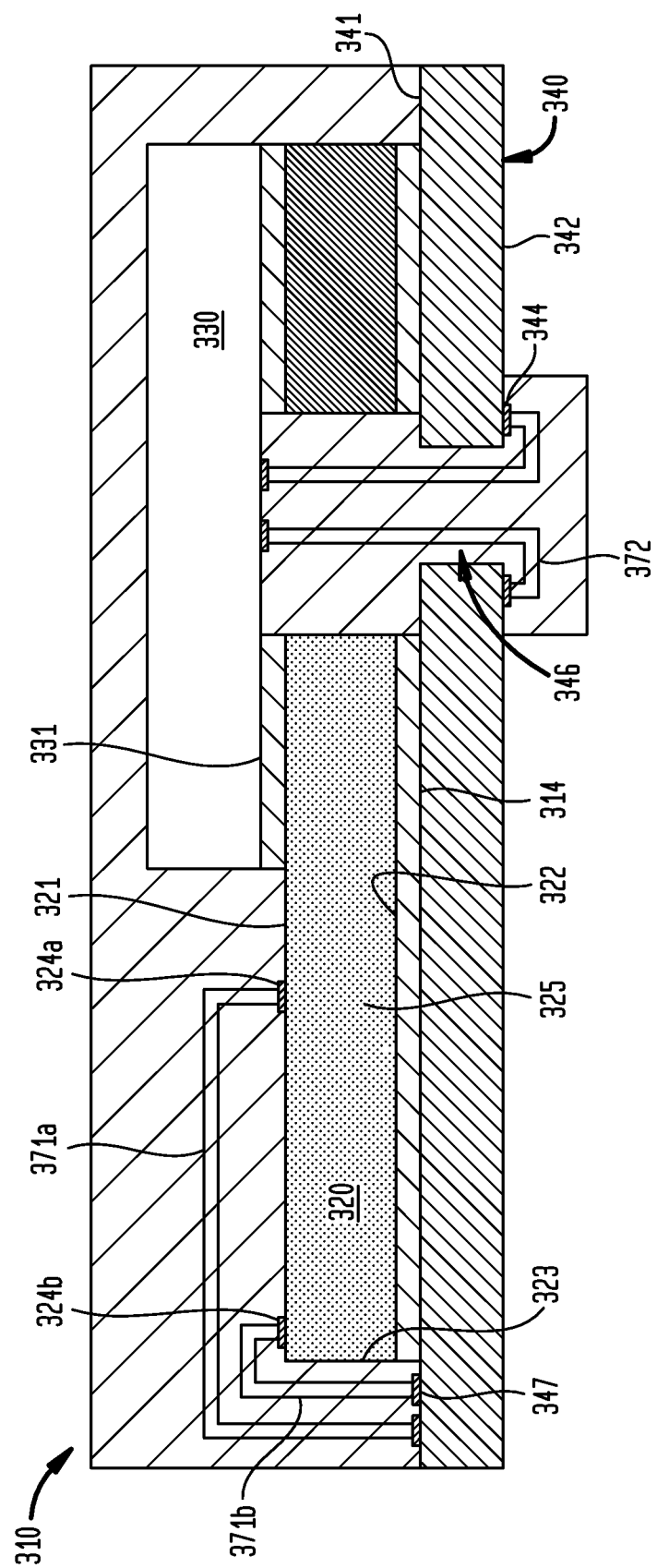
FIG. 3 is a diagrammatic sectional view of a stacked microelectronic assembly according to another embodiment having a face-up microelectronic element.

FIG. 3 shows another variation of the embodiment described above with respect to FIGS. 1A through 1C. In this variation, a module 310 is the same as the module 10 described above, except that the first microelectronic element 320 is positioned with the rear surface 322 thereof facing the first surface 341 of the module card 340 and at least a portion of the front surface 321 thereof facing and partially overlying at least a portion of the front surface 331 of the second microelectronic element 330. The rear surface 322 of the first microelectronic element 320 can be attached to the first surface 341 of the module card 340 by one or more adhesive layers such as the adhesive layers 14 shown in FIGS. 1A and 1C. Conductive contacts 324a and 324b (collectively conductive contacts 324) can be exposed at the front surface 321 of the first microelectronic element 320. The chip contacts 324 of the first microelectronic element 320 can include any configuration of conductive contacts 324a and/or 324b.

The conductive contacts 324a of the first microelectronic element 320 can be exposed at the front surface 321 within a central region 325 of the first microelectronic element. For example, the contacts 324a can be arranged in one or two parallel rows adjacent the center of the front surface 321. The conductive contacts 324a can be electrically connected to conductive contacts 347 exposed at the first surface 341 of the module card 340, for example, by wire bonds 371a.

The conductive contacts 324b of the first microelectronic element 320 can be exposed at the front surface 321 near a lateral edge 323 of the first microelectronic element. For example, the contacts 324b can be arranged in one or two parallel rows adjacent the lateral edge 323 of the first microelectronic element 320. The conductive contacts 324b can be electrically connected to conductive contacts 347 exposed at the first surface 341 of the module card 340, for example, by wire bonds 371b.

Similar to FIG. 2, conductive traces (not shown in FIG. 3) can extend from the conductive contacts 347 and 344 along the respective first and second surfaces 341, 342 of the module card 340 to exposed edge contacts at insertion edges of the module card such as the insertion edge 43 shown in FIGS. 1B and 1C.

Figure 5:
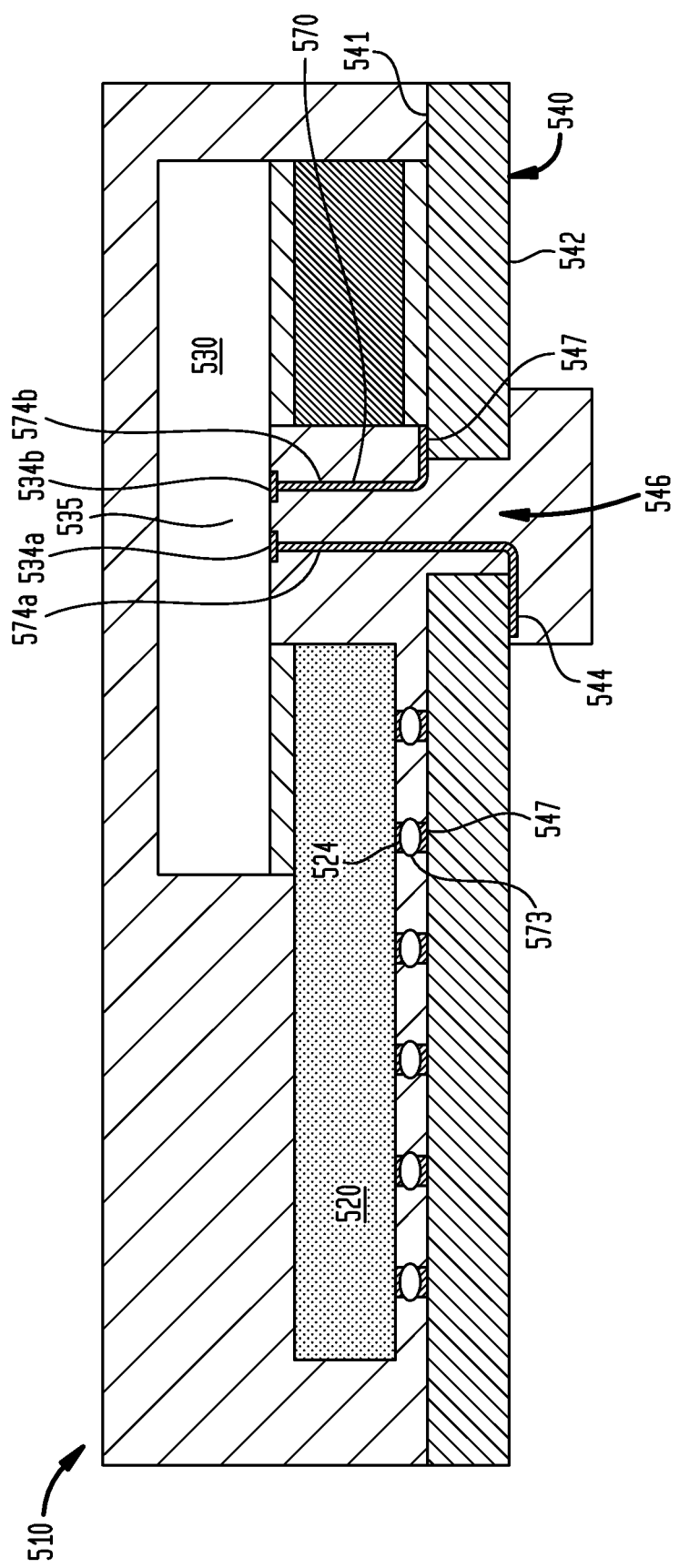
FIG. 5 is a diagrammatic sectional view of a stacked microelectronic assembly according to another embodiment having lead bonds.
Figure 6:
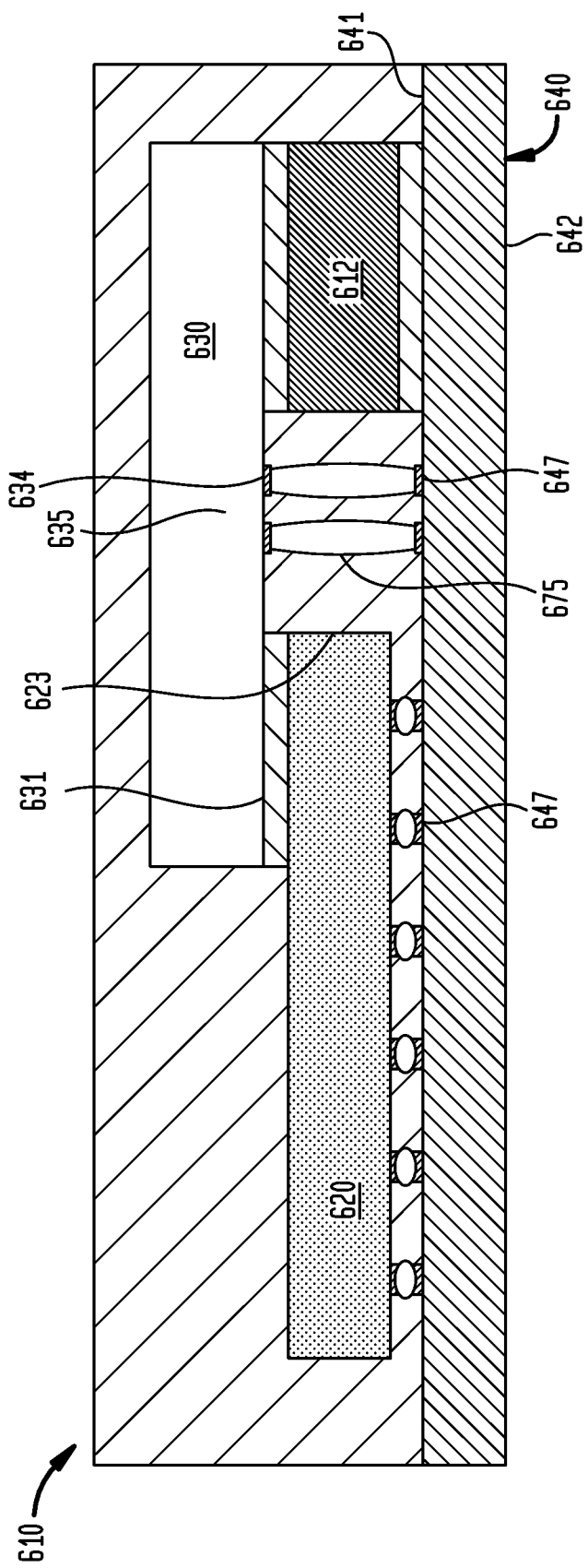
FIG. 6 is a diagrammatic sectional view of a stacked microelectronic assembly according to another embodiment having elongated solder connects.

Although the embodiment shown in FIG. 3 is shown with the second microelectronic element 330 being electrically connected to the module card 340 by wire bonds 372, in other embodiments, the second microelectronic element can be electrically connected to the module card in various other ways, including for example, lead bonds (as shown in FIG. 5) or flip-chip bonding with solder (as shown in FIGS. 6 and 7).

Figure 4:
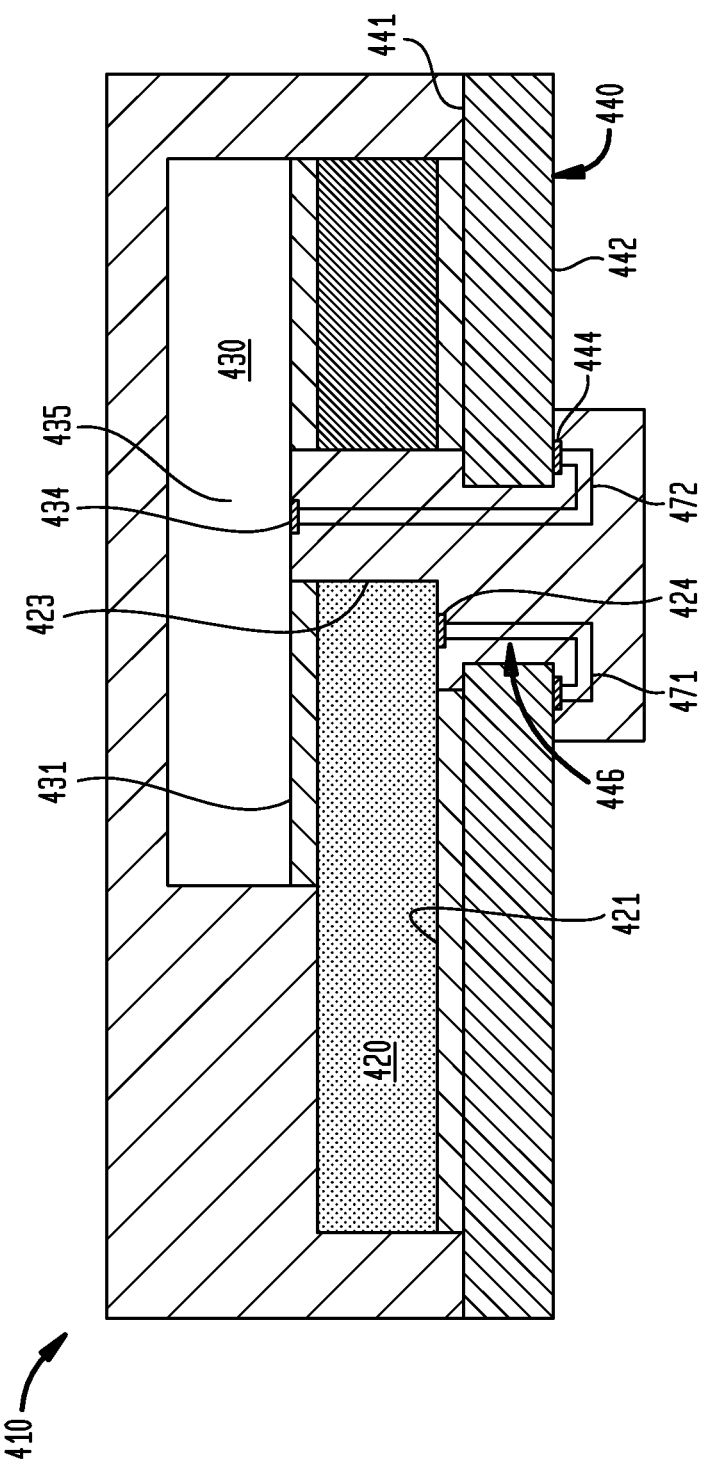
FIG. 4 is a diagrammatic sectional view of a stacked microelectronic assembly according to another embodiment having a single window in the module card through which wire bonds attached to two microelectronic elements extend.

FIG. 4 shows another variation of the embodiment described above with respect to FIGS. 1A through 1C. In this variation, a module 410 is the same as the module 10 described above, except that first and second microelectronic elements 410 and 420 are electrically connected to the module card 440 by respective wire bonds 471 and 472 extending through a common aperture 446 extending between first and second surfaces 441, 442 of the module card, rather than having each microelectronic element be electrically connected to the module card by wire bonds extending through respective separate apertures of the module card.

As shown in FIG. 4, the conductive contacts 424 of the first microelectronic element 420 can be exposed at the front surface 421 near a lateral edge 423 of the first microelectronic element. For example, the contacts 424 can be arranged in a row adjacent the lateral edge 423 of the first microelectronic element 420. The conductive contacts 424 can be electrically connected to conductive contacts 444 exposed at the second surface 442 of the module card 440, for example, by wire bonds 471.

The conductive contacts 434 of the second microelectronic element 430 can be exposed at the front surface 431 within a central region 435 of the second microelectronic element. For example, the contacts 434 can be arranged in a row approximately at the center of the front surface 431. The conductive contacts 434 can be electrically connected to conductive contacts 444 exposed at the second surface 442 of the module card 440, for example, by wire bonds 472.

In the embodiment shown in FIG. 4, the module 410 can include a single second encapsulant 465. For example, a second encapsulant 65 can cover portions of the front surfaces 421 and 431 of the respective microelectronic elements 420 and 430 exposed within the single common aperture 446, a portion of the second surface 442 of the module card 440, the contacts 424, 434, and 444, and the wire bonds 471 and 472 extending between the respective contacts 424 and 434 and the corresponding contacts 444.

FIG. 5 shows another variation of the embodiment described above with respect to FIGS. 1A through 1C. In this variation, a module 510 is the same as the module 10 described above, except that the first microelectronic element 520 is flip-chip bonded to the first surface 541 of the module card 540 (in the same manner as in FIG. 2), and the second microelectronic element 530 is electrically connected to the module card 540 by lead bonds 574a and 574b (collectively the lead bonds 574) extending from conductive traces to the chip contacts 534 rather than by wire bonds.

As shown in FIG. 5, the conductive contacts 534a and 534b (collectively the conductive contacts 534) of the second microelectronic element 530 can be exposed at the front surface 531 within a central region 535 of the second microelectronic element. For example, the contacts 534 can be arranged in one or two parallel rows adjacent the center of the front surface 531. Some of the conductive contacts 534a can be electrically connected to conductive contacts 544 exposed at the second surface 542 of the module card 540, for example, by lead bonds 574a. Others of the conductive contacts 534b can be electrically connected to conductive contacts 547 exposed at the first surface 541 of the module card 540, for example, by lead bonds 574b. As shown in FIG. 5, the conductive contacts 544 and 547 can be conductive contact portions of the respective lead bonds 574a and 574b.

The process of forming the lead bonds 574 can generally be as described in commonly assigned U.S. Pat. Nos. 5,915,752 and 5,489,749, the disclosures of which are incorporated by reference herein. In the lead bonding process, each lead 570 can be displaced downwardly by a tool such as a thermosonic bonding tool into engagement with a corresponding conductive contact 534. Such a bonding tool can be inserted through the aperture 546 to electrically connect the leads 570 to the corresponding conductive contacts 534. Frangible sections of the leads 570 can be broken during this process.

FIG. 6 shows another variation of the embodiment described above with respect to FIGS. 1A through 1C. In this variation, a module 610 is the same as the module 10 described above, except that the first microelectronic element 620 is flip-chip bonded to the first surface 641 of the module card 640 (in the same manner as in FIG. 2), and the second microelectronic element 630 is flip-chip bonded to the first surface of the module card by conductive masses 675 extending between the conductive contacts 634 of the second microelectronic element and conductive contacts 647 exposed at the first surface of the module card rather than by wire bonds. In a particular embodiment, the module card 640 can be devoid of leads extending through apertures between the first and second surfaces 641, 642 thereof, such as the apertures 45 and 46 shown in FIG. 1A.

Similar to the module 10 described above, the conductive contacts 634 of the second microelectronic element 630 can be exposed at the front surface 631 within a central region 635 of the second microelectronic element. For example, the contacts 634 can be arranged in one or two parallel rows adjacent the center of the front surface 631.

The conductive masses 675 can be, for example, elongated solder connects, solder balls, or any other material described above with reference to the conductive masses 273. Such conductive masses 675 can extend through the space between the spacer 612 and the lateral edge 623 of the first microelectronic element 620 to electrically connect the second microelectronic element 630 with the module card 640.

FIGS. 7A and 7B show another variation of the embodiment described above with respect to FIG. 6. In this variation, a module 710 is the same as the module 610 described above, except that the second microelectronic element 730 is flip-chip bonded to the first surface 741 of the module card 740 by conductive masses 775 extending between conductive contacts 734 located adjacent a lateral edge 733 of the second microelectronic element and conductive contacts 747 exposed at the first surface of the module card, rather than having the conductive masses extend between conductive contacts exposed at the front surface of the second microelectronic element within a central region of the second microelectronic element.

The first microelectronic element 720 can have a plurality of element contacts 724 at the front surface 721 of the first microelectronic element. The element contacts 724 can be joined with a first set of the substrate contacts 747a, such that the element contacts are flip-chip bonded with the substrate contacts. As shown in FIG. 7B, the element contacts 724 and the first set of the substrate contacts 747a can each be arranged in an area array configuration.

In a particular example, the contacts 734 at the front surface 731 of the second microelectronic element 730 can be arranged in a column adjacent the lateral edge 733 of the second microelectronic element, such that the contacts 734 can project beyond the lateral edge 723 of the first microelectronic element 720. The element contacts 734 can be joined with a second set of the substrate contacts 747b, such that the element contacts are flip-chip bonded with the substrate contacts.

Although the contacts 724, 734, and 747 are shown arranged in parallel columns of contacts, other arrangements of contacts are contemplated by the invention. For example, although not shown in FIG. 7B, at least one contact may be disposed between adjacent columns of contacts. In another example, such as seen in FIG. 7C, the contacts may include a column of contacts for which a column axis 719 extends through a majority of the contacts 724 of such column, i.e., is centered relative thereto. However, in such column, one or more of the contacts 724 might not be centered relative to the column axis 719, as in the case of contacts 724'. In this case, these one or more contacts 724' are considered part of a particular column, even though such contact(s) might not be centered relative to axis 719 because they are closer to the axis 719 of that particular column than to the axis of any other column. The column axis 719 may extend through these one or more contacts that are not centered relative to the column axis, or, in some cases, the non-centered contacts may be farther from the column axis such that the column axis 719 may not even pass through these non-centered contacts of the column. There may be one, several, or many contacts in one column or even in more than one column that are not centered with respect to a column axis of the respective column.

Moreover, it is possible for the microelectronic elements 720, 730 and the substrate 740 to contain arrangements of contacts 724, 734, and 747 in groupings other than columns, such as in arrangements shaped like rings, polygons or even scattered distributions of contacts.

In one embodiment, similar to the module 610 described above, the module card 740 can be devoid of leads extending through apertures between the first and second surfaces 741, 742 thereof.

Figure 8:
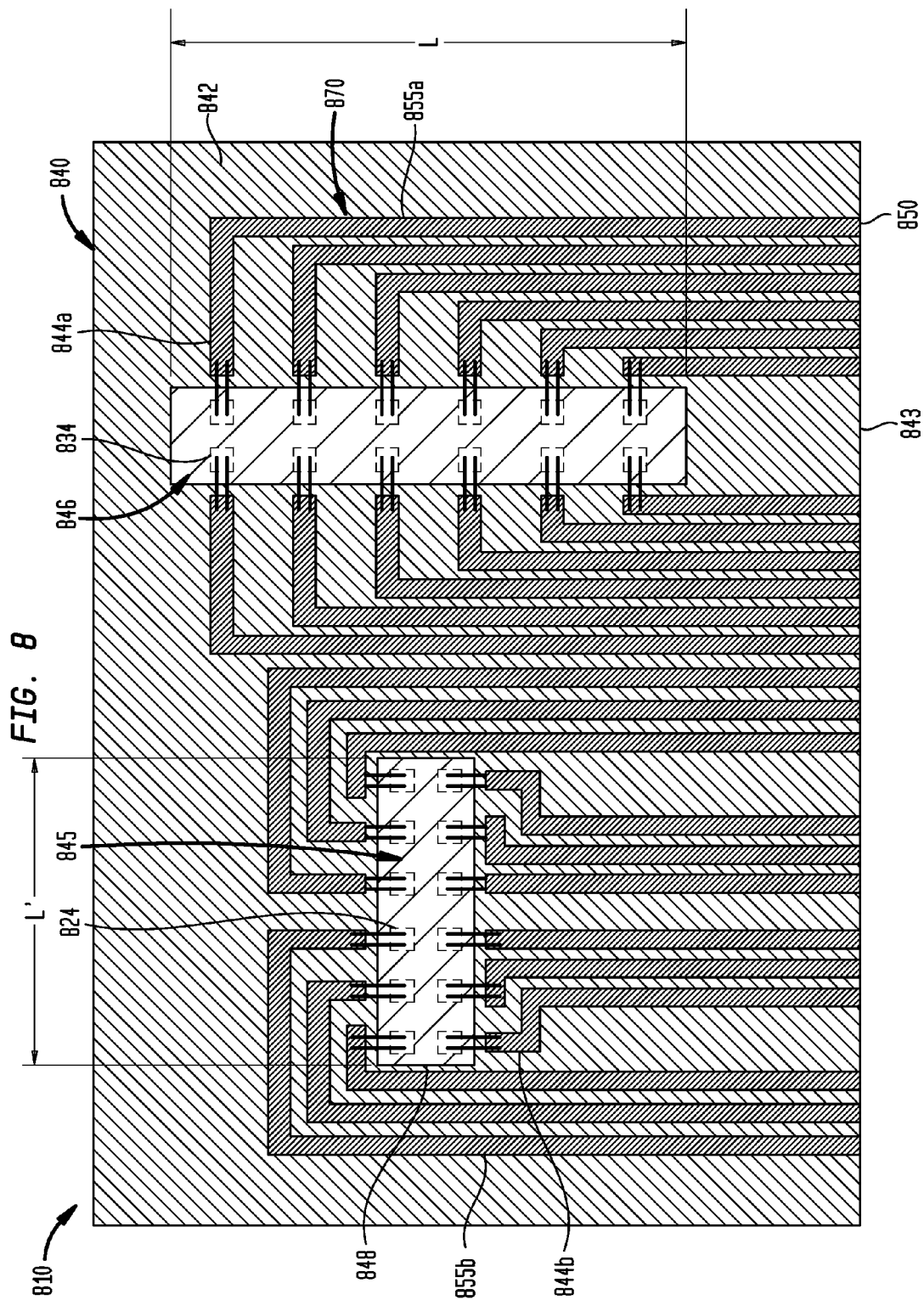
FIG. 8 is a variation of the bottom sectional view of the stacked assembly of FIG. 1B, in which one microelectronic elements has rows of central contacts oriented substantially perpendicular to rows of central contacts of another microelectronic element.

FIG. 8 shows another variation of the embodiment described above with respect to FIG. 1B. In this variation, a module 810 is the same as the module 10 described above, except that the rows of conductive contacts 824 of the first conductive element 820 can be substantially perpendicular to the rows of conductive contacts 834 of the second conductive element 830. In such an embodiment, the second aperture 846 can have a long dimension L extending in a direction away from the insertion edge 843 of the module card 840, similar to the second aperture 46 shown in FIG. 1B. The first aperture 845 can be have a long dimension L' extending in a direction substantially parallel to the insertion edge 843 of the module card 840 and substantially perpendicular to the long dimension L of the second aperture 846.

The leads 870 can include a pattern of conductive traces 855a that is the same as the pattern of conductive traces 55 shown in FIG. 1B. The leads 870 can further include an alternate pattern of conductive traces 855b extending from the conductive contacts 844b exposed at the second surface 842 of the module card 840 to the exposed edge contacts 850. In a particular embodiment, some of the conductive traces 855b can extend around lateral edges 848 of the first aperture 845.

FIG. 9 shows a variation of the embodiment described above with respect to FIGS. 1A through 1C. In this variation, a module 910 is the same as the module 10 described above, except that the first and second microelectronic elements 920 and 930 are mounted onto a lead frame 980 rather than being mounted onto a module card such as the module card 40 shown in FIG. 1A. In a particular embodiment, the front surfaces 921, 931 of the first and second microelectronic elements 920, 930 can face a first surface 981 of the lead frame 980, each microelectronic element being electrically connected to the lead frame.

Examples of lead frame structures are shown and described in U.S. Pat. Nos. 7,176,506 and 6,765,287, the disclosures of which are hereby incorporated by reference herein. In general, a lead frame such as the lead frame 980 is a structure formed from a sheet of conductive metal, such as copper, that is patterned into segments including a plurality of leads or conductive trace portions 985. In example embodiments, at least one of the first and second microelectronic element 920, 930 can be mounted directly onto the leads, which can extend under the microelectronic elements. In such an embodiment, contacts 924, 934 on the microelectronic elements can be electrically connected to respective leads by solder balls or the like. The leads can then be used to form electrical connections to various other conductive structures for carrying an electronic signal potential to and from the microelectronic elements 920, 930. When the assembly of the structure is complete, which can include forming an encapsulation layer 960 thereover, temporary elements such as a frame (not shown) can be removed from the leads of the lead frame 980, so as to form individual leads or conductive trace portions 985.

The first microelectronic element 920 can be attached to the lead frame 980 by one or more adhesive layers 914 extending between the front surface 921 of the first microelectronic element and a first surface 981 of the lead frame. Such adhesive layers 914 can be similar to the adhesive layers 14 described above with reference to FIGS. 1A through 1C. The spacer 912 can be attached to the lead frame 980 be one or more adhesive layers 914 extending between a front surface 913 of the spacer and the first surface 981 of the lead frame. At least a portion of the front surface 931 of the second microelectronic element 930 can partially overlie the rear surface 922 of the first microelectronic element 920 and a rear surface 915 of the spacer 912. The front surface 931 of the second microelectronic element 930 can be attached to the rear surface 922 of the first microelectronic element 920 and the rear surface 915 of the spacer 912 by one or more adhesive layers 914.

Figure 9A:
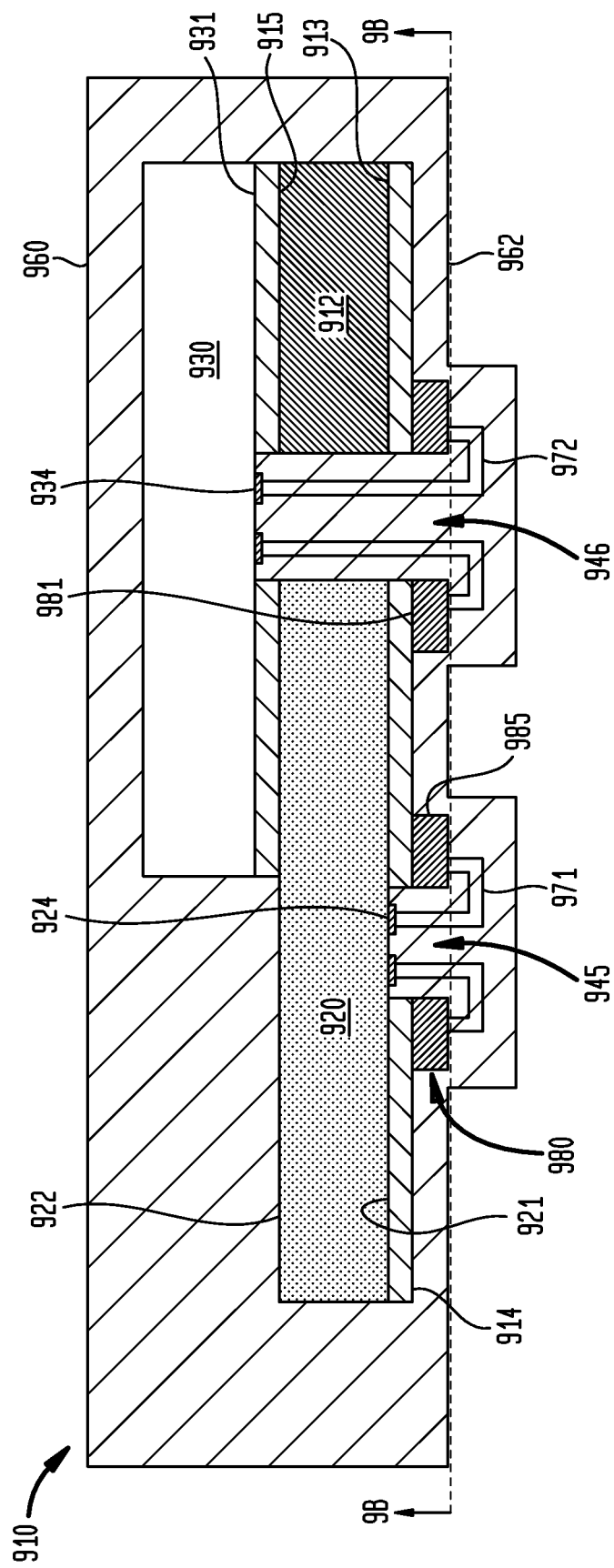
FIG. 9A is a diagrammatic sectional view of a stacked microelectronic assembly according to another embodiment having a lead frame.
Figure 9B:
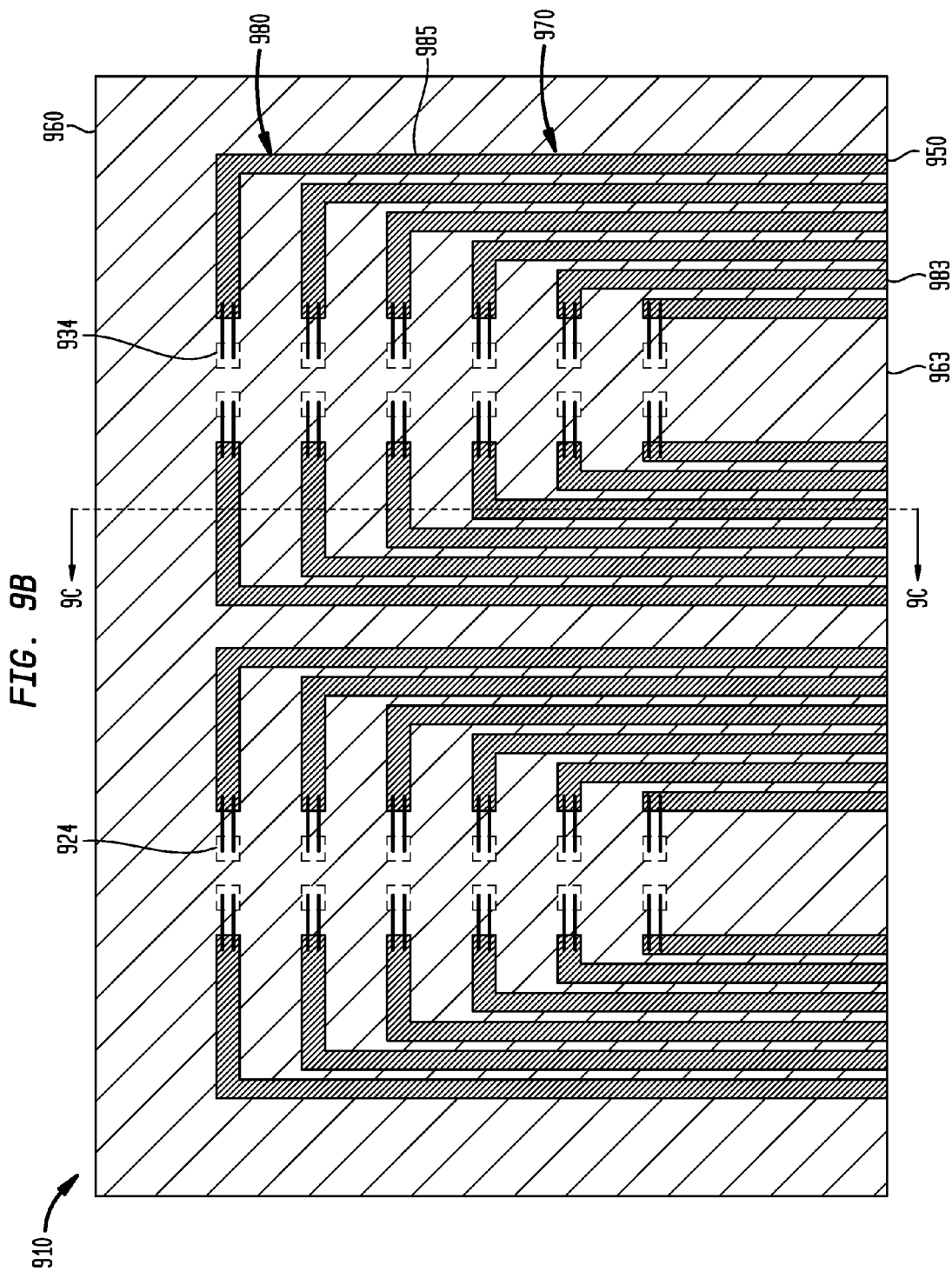
FIG. 9B is a bottom sectional view of the stacked assembly of FIG. 9A, taken along the line 9B-9B of FIG. 9A.
Figure 9C:
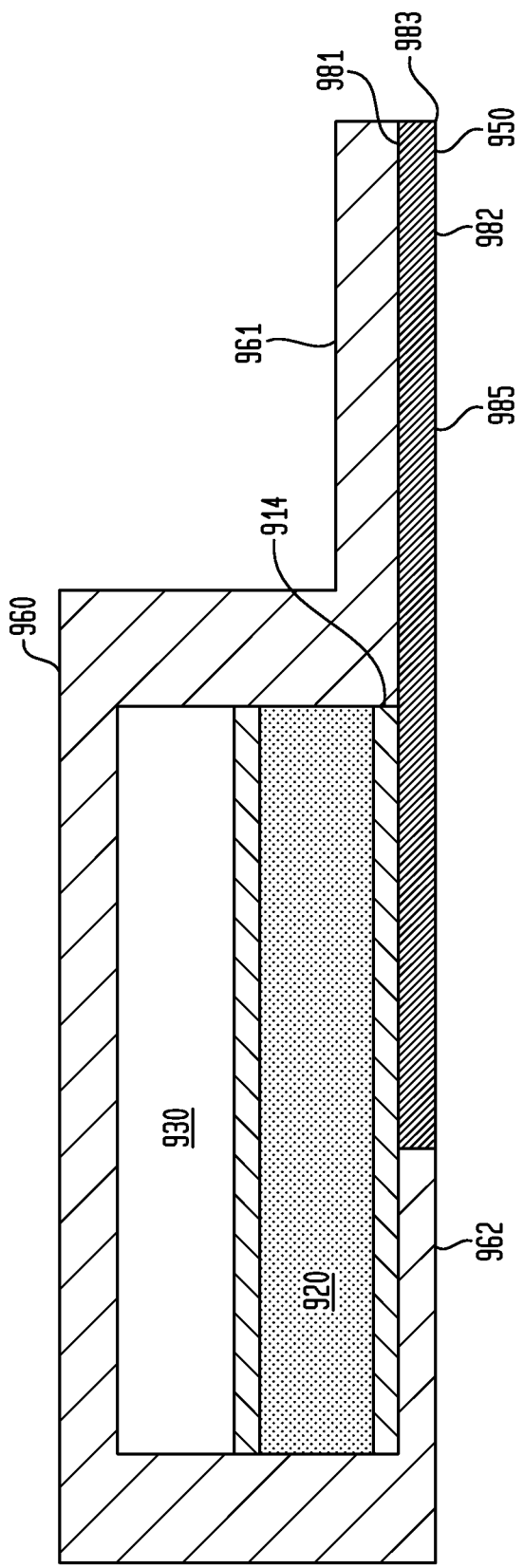
FIG. 9C is a side sectional view of the stacked assembly of FIG. 9B, taken along the line 9C-9C of FIG. 9B.

As seen in FIGS. 9A through 9C, electrical connections or leads 970 can electrically connect the contacts 924 of the first microelectronic element 920 and the contacts 934 of the second microelectronic element 930 to the exposed module contacts 950. The leads 970 may include wire bonds 971 and 972 and conductive trace portions 985 of the lead frame 980. In a particular example, the leads 970 can be usable to carry an address signal usable to address a memory storage element in at least one of the first and second microelectronic elements 920, 930.

In one example, the lead frame 980 can define a first gap 945 and a second gap 946 extending between the first surface 981 of the lead frame and a second surface 982 of the lead frame opposite the first surface. The first gap 945 can be aligned with the chip contacts 924 of the first microelectronic element 920, such that the wire bonds 971 can extend between the chip contacts 924 and the second surface 982 of the lead frame through the first gap. The second gap 946 can be aligned with the chip contacts 934 of the second microelectronic element 930, such that the wire bonds 972 can extend between the chip contacts 934 and the second surface 982 of the lead frame through the second gap.

The module 910 can also include an encapsulant 960 that can cover the first and second microelectronic elements 20, 30 and a portion of the lead frame 980, such that the exposed module contacts 950 can be exposed at a lower surface 962 of an insertion portion 961 of the encapsulant. The encapsulant 960 can also cover the contacts 924, 934, and the wire bonds 971 and 972 extending between the respective contacts 924 and 934 and the lead frame 980. The insertion portion 961 of the encapsulant 960 can have an appropriate size and shape for mating with a corresponding socket (shown in FIG. 12) when the module 910 is inserted in the socket.

In a particular embodiment, the module 910 can have a plurality of parallel exposed module contacts 950 adjacent an insertion edge 983 of at least one of the first and second surfaces 981, 982 for mating with corresponding contacts of a socket (shown in FIG. 12) when the module 910 is inserted in the socket. Some or all of the module contacts 950 can be exposed at either or both of the first or second surfaces 981, 982 of the lead frame 980.

Figure 10A:
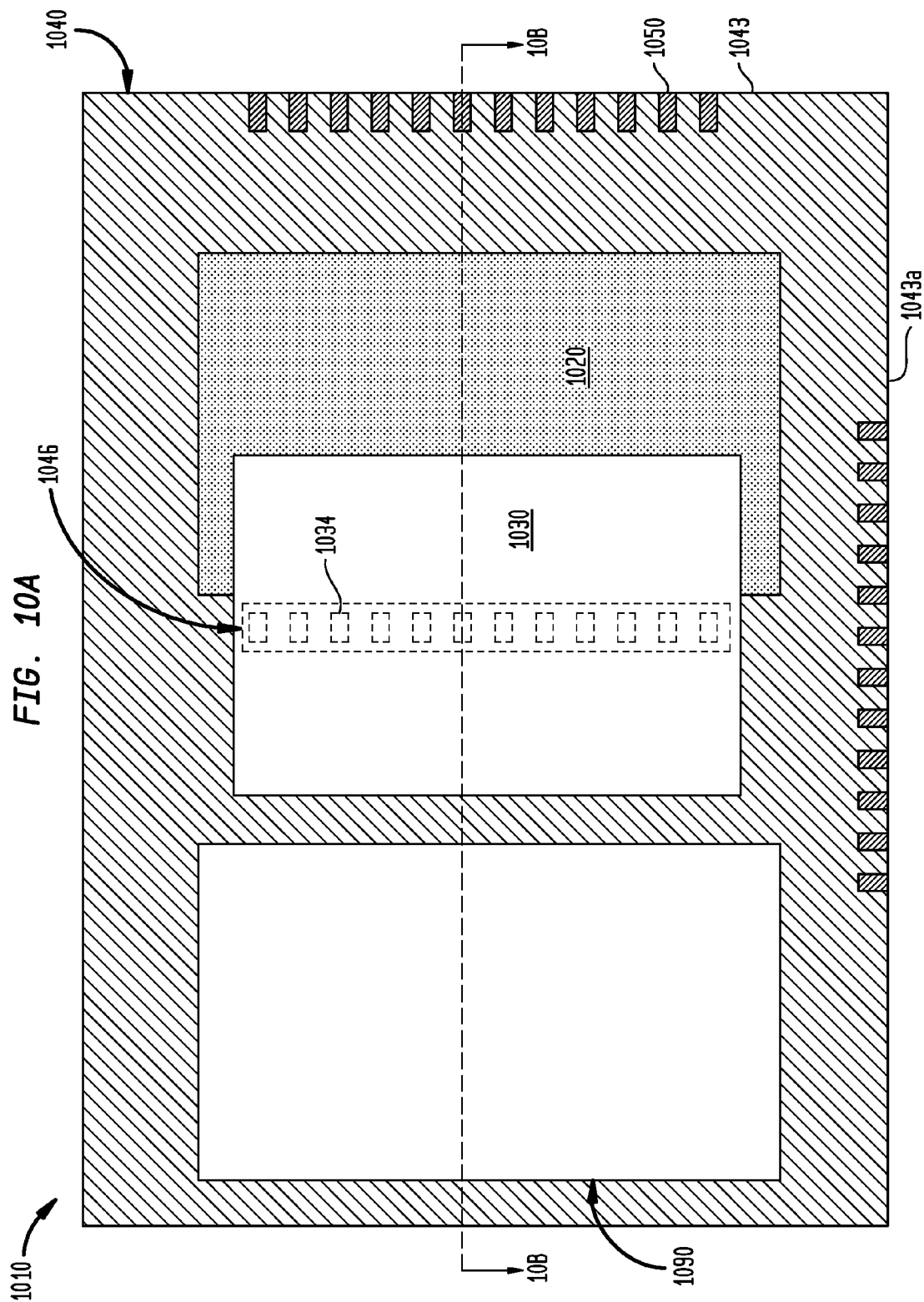
FIG. 10A is a diagrammatic top view of a stacked microelectronic assembly according to another embodiment having a plurality of stacked microelectronic elements, shown without an encapsulant.
Figure 10B:
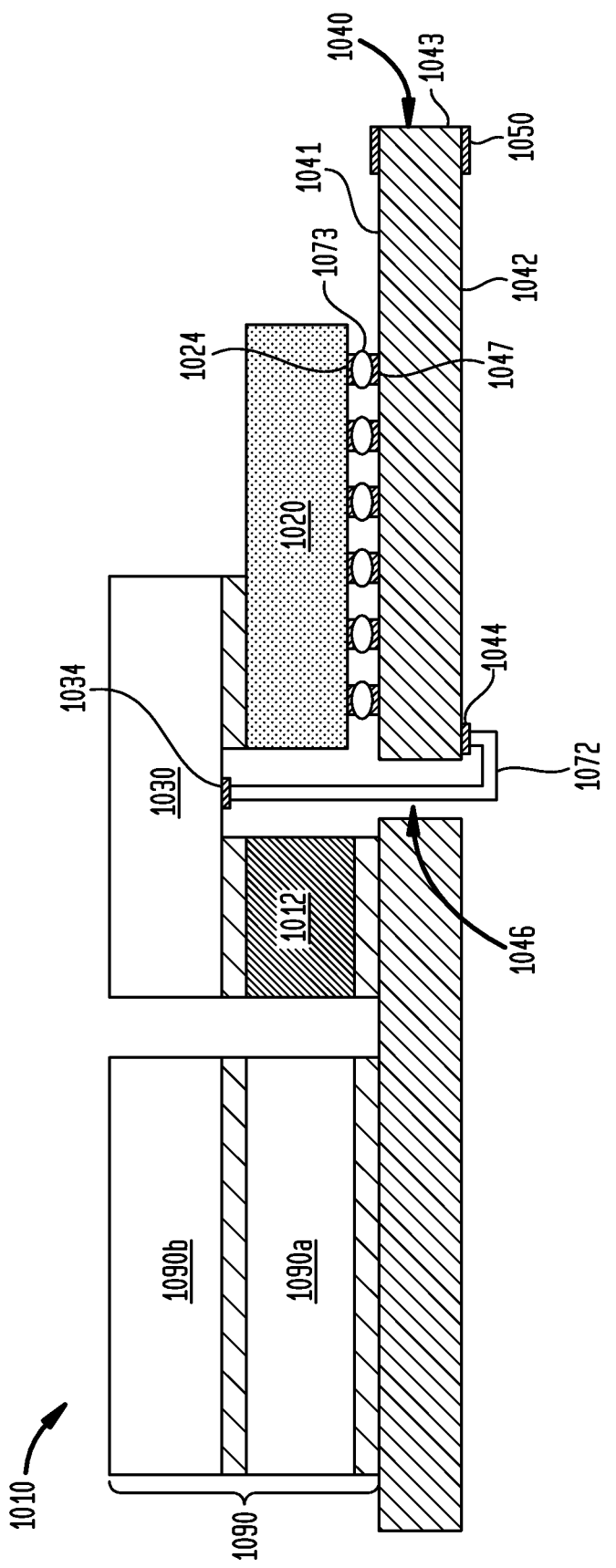
FIG. 10B is a side sectional view of the stacked assembly of FIG. 10A, taken along the line 10B-10B of FIG. 10A.

FIGS. 10A and 10B show a variation of the embodiment described above with respect to FIG. 2. In this variation, a module 1010 is the same as the module 210 described above, except that the module 1010 also includes a stack of third microelectronic elements 1090 mounted onto the module card 1040.

Similar to FIG. 2, the first microelectronic element 1020 is flip-chip bonded to the first surface 1041 of the module card 1040. The conductive contacts or chip contacts 1024 of the first microelectronic element 1020 can be electrically connected to conductive contacts 1047 exposed at the first surface 1041 of the module card 1040, for example, by conductive masses 1073. Chip contacts 1034 of the second microelectronic element 1030 can be electrically connected to corresponding conductive contacts 1044 of the module card 1040 by wire bonds 1072 extending through an aperture 1046 of the module card. Conductive traces (not shown in FIGS. 10A and 10B) can extend from the conductive contacts 1044 and 1047 along the first surface 1041 and/or the second surface 1042 of the module card 1040 to exposed edge contacts 1050 at an insertion edge of the module card such as the edge 1043 or the edge 1043a. As shown in FIG. 10B, the edge contacts 1050 can be exposed at the first surface 1041, the second surface 1042, or both surfaces.

There can be any number of third microelectronic elements 1090 in the stack, including, for example, two third microelectronic elements 1090a and 1090b as shown in FIG. 10B. The third microelectronic elements 1090 can be connected with one another and/or with the edge contacts 1050 by any interconnection configuration. For example, the lower third microelectronic element 1090a can be connected with contacts exposed at a surface of the module card 1040 via flip-chip bonding, wire bonds, lead bonds, or other interconnection configurations. One or more upper third microelectronic elements 1090b can be connected with contacts of the module card 1040 through conductive vias extending through the lower third microelectronic element 1090a, wire bonds, lead bonds, or other interconnection configurations.

In an exemplary embodiment, the module 1010 can be configured to function as a solid state memory drive. In such an example, the first microelectronic element 1020 can include a semiconductor chip configured predominantly to perform a logic function, such as a solid state drive controller, and the second microelectronic element 1030 can include a memory storage element such as volatile RAM, for example, DRAM. The third microelectronic elements 1090 can each include memory storage elements such as nonvolatile flash memory. The first microelectronic element 1020 can include a special purpose processor that is configured to relieve a central processing unit of a system such as the system 1200 (FIG. 12) from supervision of transfers of data to and from the memory storage elements included in the second microelectronic element 1030 and the third microelectronic elements 1090. Such a first microelectronic element 1020 including a solid state drive controller can provide direct memory access to and from a data bus on a motherboard (e.g., the circuit panel 1202 shown in FIG. 12) of a system such as the system 1200.

In another embodiment, the module 1010 can be configured to function as a graphics module, for example, that can be plugged into a PCI express slot of a notebook personal computer. In such an example, the first microelectronic element 1020 can include a semiconductor chip configured predominantly to perform a logic function, such as a graphics processor, and the second microelectronic element 1030 can include a memory storage element such as volatile RAM (e.g., DRAM) that can serve as a volatile frame buffer for computational graphics rendering. The third microelectronic elements 1090 can each include memory storage elements such as nonvolatile flash memory.

Figure 10C:
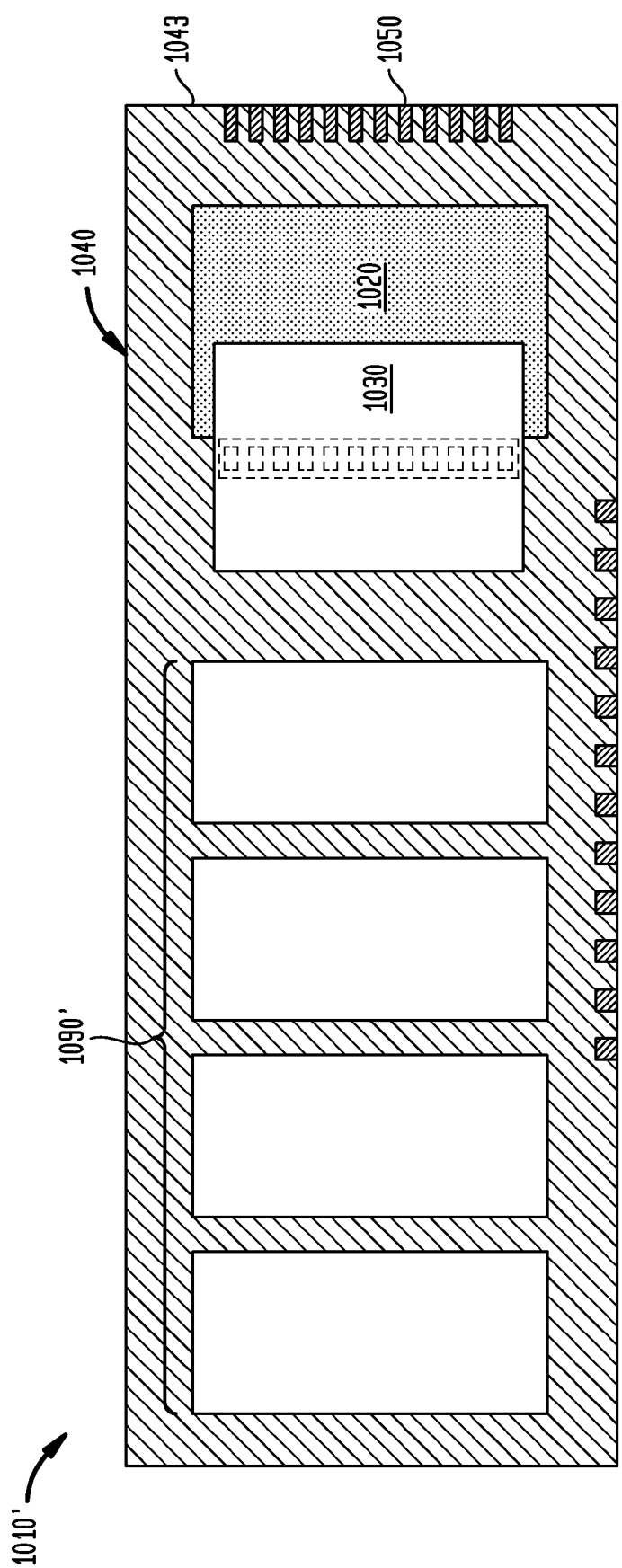
FIG. 10C is a diagrammatic top view of a stacked microelectronic assembly according to another embodiment having a plurality of microelectronic elements adjacent to one another.

FIG. 10C shows a variation of the embodiment described above with respect to FIGS. 10A and 10B. In this variation, a module 1010' is the same as the module 1010 described above, except that the module 1010' includes a plurality of third microelectronic elements 1090' mounted onto the module card 1040 adjacent to one another rather than in a stacked configuration. Similar to the module 1010, the third microelectronic elements 1090' can be connected with contacts exposed at a surface of the module card 1040 by any interconnection configuration, such as flip-chip bonding, wire bonds, lead bonds, or other interconnection configurations. The module 1010' can be used for similar exemplary functions as the module 1010, such as a solid state memory drive or a graphics module.

Figure 11:
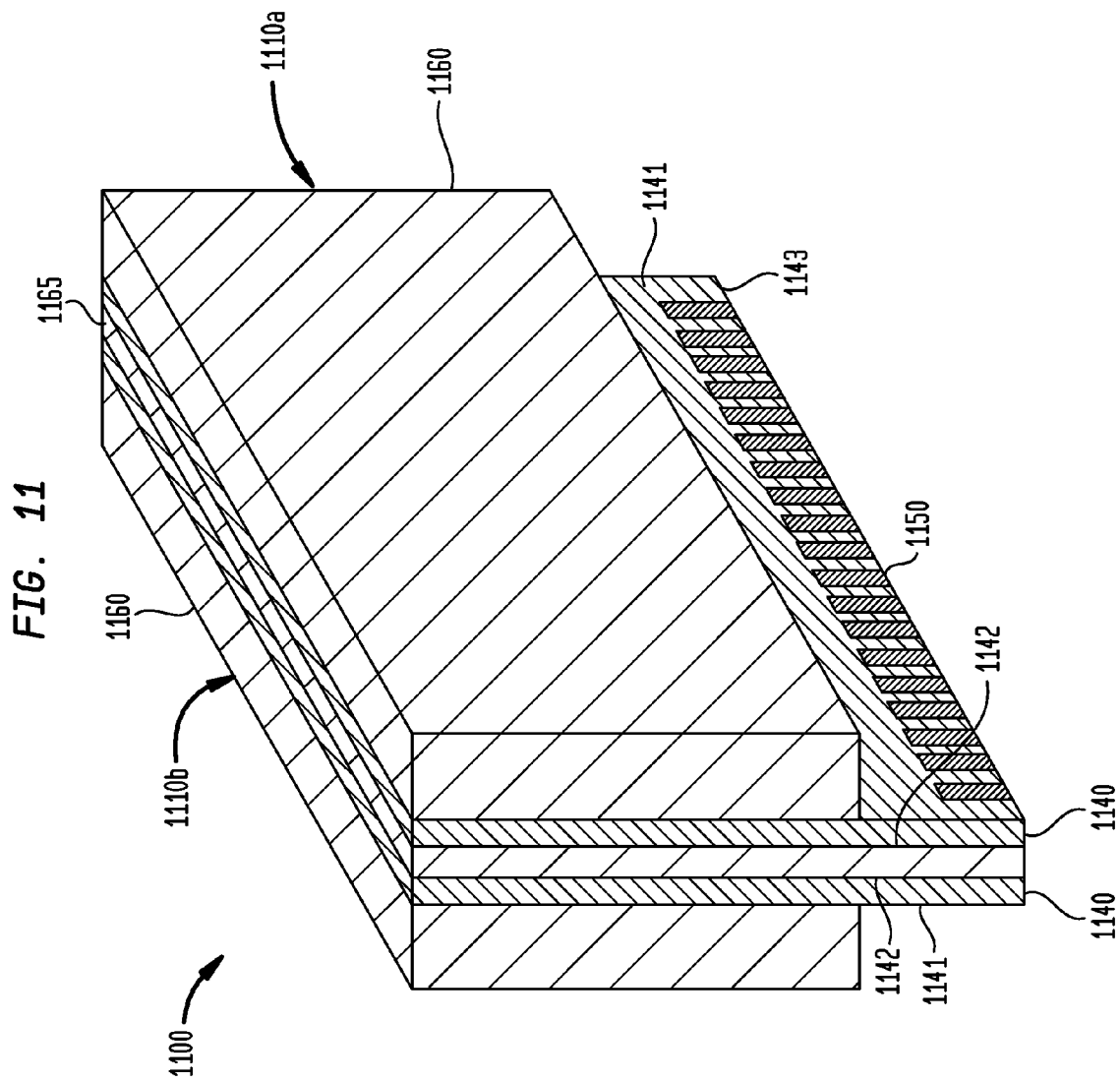
FIG. 11 is a diagrammatic perspective view of a stacked microelectronic assembly according to another embodiment including two module cards bonded to one another.

FIG. 11 depicts a component 1100 including first and second modules 1110a and 1110b according to any of the embodiments described above, such as for example, the module 10 described with reference to FIGS. 1A through 1C. The first and second modules 1110a, 1110b can be bonded to one another with at least one layer 1165, such that the second surfaces 1142 of the respective module cards 1140 of the modules can face one another. In a particular embodiment, the at least one layer 1165 can be a single common encapsulant such as the second encapsulant 65 shown in FIGS. 1A and 1B. In another example, the at least one layer 1165 can be one or more adhesive layers, similar to the adhesive layers 14 described with reference to FIGS. 1A through 1C.

The component 1100 can have one or more rows of parallel exposed edge contacts 1150 adjacent an insertion edge 1143 of the component. Each of the first and second modules 1110a, 1110b can have a row of edge contacts 1150 exposed at the first surface 1141 of the respective module card 1140, such that the edge contacts can be suitable for mating with corresponding contacts of a socket (similar to the socket shown in FIG. 12) when the component 1100 is inserted in the socket.

Figure 12:
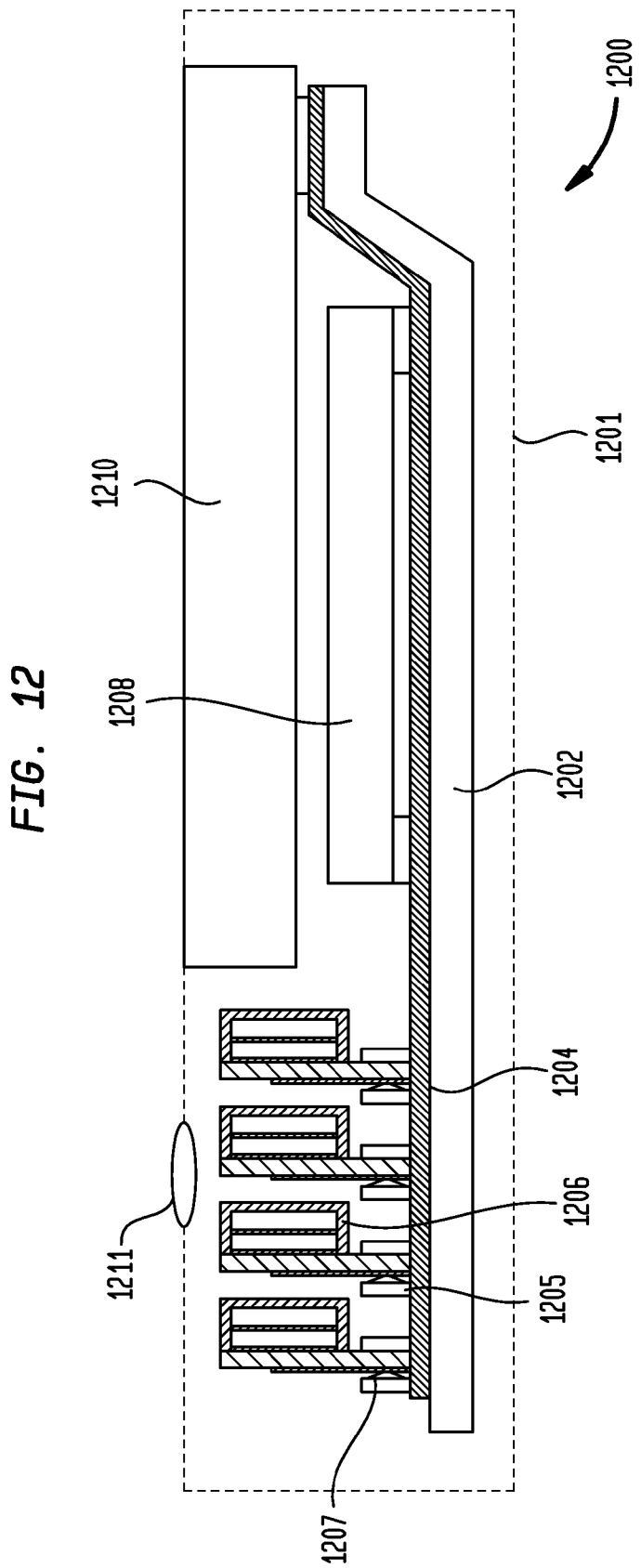
FIG. 12 is a schematic depiction of a system according to one embodiment including a plurality of modules.

The modules and components described above with reference to FIGS. 1A through 10 can be utilized in construction of diverse electronic systems, such as the system 1200 shown in FIG. 12. For example, the system 1200 in accordance with a further embodiment of the invention includes a plurality of modules or components 1206 as described above in conjunction with other electronic components 1208 and 1210.

The system 1200 can includes a plurality of sockets 1205, each socket including a plurality of contacts 1207 at one or both sides of the socket, such that each socket 1205 can be suitable for mating with corresponding exposed edge contacts or exposed module contacts of a corresponding module or component 1206. In the exemplary system 1200 shown, the system can include a circuit panel or motherboard 1202 such as a flexible printed circuit board, and the circuit panel can include numerous conductors 1204, of which only one is depicted in FIG. 12, interconnecting the modules or components 1206 with one another. However, this is merely exemplary; any suitable structure for making electrical connections between the modules or components 1206 can be used.

In a particular embodiment, the system 1200 can also include a processor such as the semiconductor chip 1208, such that each module or component 1206 can be configured to transfer a number N of data bits in parallel in a clock cycle, and the processor can be configured to transfer a number M of data bits in parallel in a clock cycle, M being greater than or equal to N.

In one example, the system 1200 can include a processor chip 1208 that is configured to transfer thirty-two data bits in parallel in a clock cycle, and the system can also include four modules 1206 such as the module 10 described with reference to FIGS. 1A through 1C, each module 1206 configured to transfer eight data bits in parallel in a clock cycle (i.e., each module 1206 can include first and second microelectronic elements, each of the two microelectronic elements being configured to transfer four data bits in parallel in a clock cycle).

In another example, the system 1200 can include a processor chip 1208 that is configured to transfer sixty-four data bits in parallel in a clock cycle, and the system can also include four modules 1206 such as the component 1000 described with reference to FIG. 12, each module 1206 configured to transfer sixteen data bits in parallel in a clock cycle (i.e., each module 1206 can include two sets of first and second microelectronic elements, each of the four microelectronic elements being configured to transfer four data bits in parallel in a clock cycle).

In the example depicted in FIG. 12, the component 1208 is a semiconductor chip and component 1210 is a display screen, but any other components can be used in the system 1200. Of course, although only two additional components 1208 and 1210 are depicted in FIG. 12 for clarity of illustration, the system 1200 can include any number of such components.

Modules or components 1206 and components 1208 and 1210 can be mounted in a common housing 1201, schematically depicted in broken lines, and can be electrically interconnected with one another as necessary to form the desired circuit. The housing 1201 is depicted as a portable housing of the type usable, for example, in a cellular telephone or personal digital assistant, and screen 1210 can be exposed at the surface of the housing. In embodiments where a structure 1206 includes a light-sensitive element such as an imaging chip, a lens 1211 or other optical device also can be provided for routing light to the structure. Again, the simplified system shown in FIG. 12 is merely exemplary; other systems, including systems commonly regarded as fixed structures, such as desktop computers, routers and the like can be made using the structures discussed above.

FIGS. 13A and 13B show a variation of the embodiment described above with respect to FIGS. 7A and 7B. In this variation, a microelectronic package 1310 is the same as the module 710 described above, except that the microelectronic package 1310 includes microelectronic elements 1320, 1330 mounted to a substrate 1340 rather than a module card, and the microelectronic package 1310 has terminals 1350 configured for interconnection with another component rather than edge contacts. In one embodiment, similar to the module 710 described above, the substrate 1340 can be devoid of leads extending through apertures of the substrate.

The first microelectronic element 1320 can have a front surface 1321 facing the first surface 1341 of the substrate 1340. The first microelectronic element 1320 can have a plurality of element contacts 1324 at the front surface 1321 of the first microelectronic element. The element contacts 1324 can be joined with a first set of the substrate contacts 1347*a*, such that the element contacts are flip-chip bonded with the substrate contacts. As shown in FIG. 13B, the element contacts 1324 and the first set of the substrate contacts 1347*a* can each be arranged in an area array configuration.

The second microelectronic element 1330 can have a front surface 1331 facing the first surface 1341 of the substrate 1340. The front surface 1331 of the second microelectronic element 1330 can partially overlie a rear surface 1322 of the first microelectronic element 1320 and can be attached thereto, for example, by an adhesive layer 1314.

The second microelectronic element 1330 can have a plurality of element contacts 1334 at the front surface 1331 of the second microelectronic element. The element contacts 1334 can be joined with a second set of the substrate contacts 1347*b*, such that the element contacts are flip-chip bonded with the substrate contacts. As shown in FIG. 13B, the element contacts 1334 and the first set of the substrate contacts 1347*b* can each be arranged in a column configuration.

Although the contacts 1324, 1334, and 1347 are shown arranged in parallel columns of contacts, other arrangements of contacts are contemplated by the invention, as described above with reference to FIGS. 7A-7C.

The substrate 1340 can further include a plurality of terminals 1350 at the second surface 1342 configured for connecting the microelectronic package 1310 to at least one component external to the package. Conductive masses 1351 can be disposed on an exposed surface of the terminals 1350. Such conductive masses 1351 can be, for example, solder balls, or any other material described above with reference to the conductive masses 273. In one example, the external component can be a circuit panel such as the circuit panel 1602 shown and described below with respect to FIG. 16.

The contacts 1324 and 1334 can be electrically connected to the respective sets of substrate contacts 1347*a* and 1347*b*, for example, by respective conductive masses 1373 and 1375. The conductive masses 1373 can be, for example, solder balls, or any other material described above with reference to the conductive masses 273. The conductive masses 1375 can be, for example, elongated solder connects, solder balls, or any other material described above with reference to the conductive masses 273.

As shown in FIG. 14A, in one variation of the embodiment of FIGS. 13A and 13B, the conductive masses 1375 and/or the conductive masses 1373 can be at least partly replaced by electrically conductive posts 1475. The electrically conductive posts may include portions which are deposited, e.g., dispensed or plated within openings within which contacts 1434 of the second microelectronic element are exposed. For example, the conductive posts 1475 can be formed by depositing a metal or other electrically conductive material, e.g., a conductive matrix material, within corresponding apertures 1476 extending at least partially through the encapsulant 1460, using a process such as those described in U.S. Patent Publication No. 2012/0126389, the disclosure of which is hereby incorporated by reference herein.

In another variation, shown in FIG. 14B, the posts may include a plurality of frustoconical shaped posts 1477 projecting away from the element contacts 1434 of the second microelectronic element 1430 towards corresponding ones of the substrate contacts 1447*b*. Each post 1477 can consist essentially of a substantially rigid electrically conductive material, for example, a metal such as copper or aluminum. In one embodiment, the posts 1477 may be formed by etching a structure such as a continuous or discontinuous metal sheet attached to the contacts. Conductive masses 1473 can be disposed between the posts 1477 and the substrate contacts 1447*b* to provide an electrical connection therebetween. As shown in FIG. 14B, the posts 1477 can have a tapered shape, such that each post has a first width adjacent the element contact 1434 that is greater than a second width adjacent the substrate contact 1447*b*.

Referring to FIG. 14C, in a variation of the embodiment of FIG. 14B, the posts may include a plurality of frustoconical shaped posts 1478 projecting away from the substrate contacts 1447b towards corresponding ones of the element contacts 1434 of the second microelectronic element 1430. Conductive masses 1473 can be disposed between the posts 1478 and the element contacts 1434 to provide an electrical connection therebetween. As shown in FIG. 14C, the posts 1478 can have a tapered shape, such that each post has a first width adjacent the substrate contact 1447b that is greater than a second width adjacent the element contact 1434.

Figure 14D:
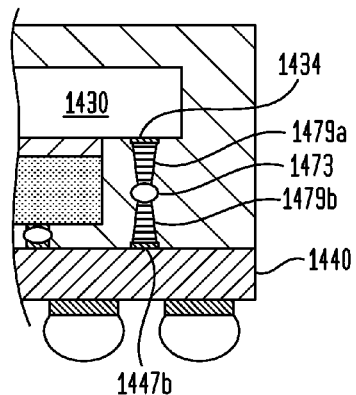

Referring to FIG. 14D, in another variation, at least some of the conductive masses 1375 can be replaced by electrically conductive posts 1479a and 1479b, the posts 1479a extending from the element contacts 1434 of the second microelectronic element 1430 towards corresponding ones of the substrate contacts 1447b, and the posts 1479b extending from the substrate contacts towards the posts 1479a. Conductive masses 1473 can be disposed between the posts 1479a and 1479b to provide an electrical connection therebetween. As shown in FIG. 14D, the posts 1479a and 1479b can each have a tapered shape, such that each post has a first width adjacent the element contact 1434 or substrate contacts 1447b that is greater than a second width adjacent the conductive mass 1473.

Figure 14E:
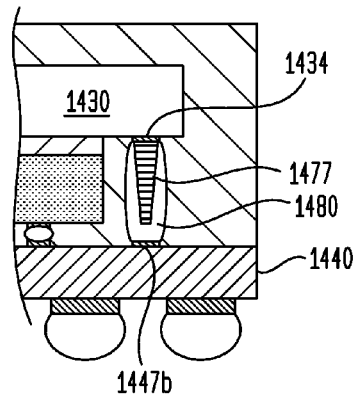

Referring to FIG. 14E, in another variation of the embodiment of FIG. 14B, elongated solder connects 1480 can be disposed around the posts 1477 between the substrate contacts 1447b and the corresponding element contacts 1434 of the second microelectronic element 1430 to provide an electrical connection between the posts and the substrate contacts. The conductive masses 1473 shown in any of the embodiments of FIGS. 14B, 14C, and 14D can be replaced with the elongated solder connects 1480 extending around the respective posts 1477, 1478, and 1479 between the element contacts 1434 and the substrate contacts 1447b.

Figure 15:
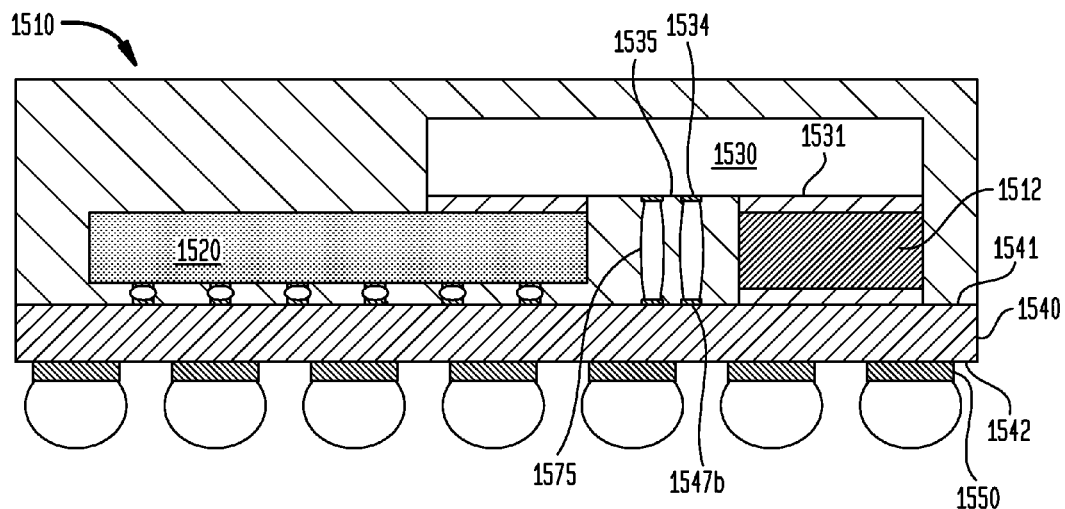
FIG. 15 is a diagrammatic sectional view of a stacked microelectronic package according to another embodiment having elongated solder connects.

FIG. 15 shows a variation of the embodiment described above with respect to FIG. 6. In this variation, a microelectronic package 1510 is the same as the module 610 described above, except that the microelectronic package 1510 includes microelectronic elements 1520 and 1530 mounted to a substrate 1540 rather than a module card, and the microelectronic package 1510 has terminals 1550 exposed at the second surface 1542 for interconnecting the package 1510 with another component, rather than edge contacts as in the embodiment illustrated with respect to FIG. 6. In one embodiment, similar to the module 610 described above, the substrate 1540 can be devoid of leads extending through apertures of the substrate.

Similar to the module 10 described above, the conductive contacts 1534 of the second microelectronic element 1530 can be exposed at the front surface 1531 within a central region 1535 of the second microelectronic element. For example, the contacts 1534 can be arranged in one or two parallel rows adjacent the center of the front surface 1531.

The conductive masses 1575 can be, for example, elongated solder connects, solder balls, or any other material described above with reference to the conductive masses 273. Such conductive masses 1575 can extend through the space between the spacer 1512 and the lateral edge 1523 of the first microelectronic element 1520 to electrically connect the second microelectronic element 1530 with the substrate 1540.

The conductive masses 1575 in FIG. 15 can be replaced by any of the alternative connections between the element contacts 1534 and the substrate contacts 1547b that are shown in FIGS. 14A-14E.

Any of the microelectronic packages described above with reference to FIGS. 13A through 15 can include additional microelectronic elements, such as, for example, the third microelectronic elements 1090a and 1090b (collectively the third microelectronic elements 1090) shown in FIGS. 10A and 10B, and the third microelectronic elements 1090' shown in FIG. 10C.

In a particular embodiment, the microelectronic package 1310 (or 1510) can include a stack of third microelectronic elements 1090 mounted onto the first surface 1341 of the substrate 1340, in a configuration similar to the arrangement of microelectronic elements shown in FIG. 10B. In such an embodiment, the third microelectronic elements 1090a and 1090b can each have a surface facing the first surface 1341 of the substrate, which is the same surface of the substrate that the front surfaces 1321 and 1331 of the microelectronic elements 1320 and 1330 face. Such a substrate 1340 including third microelectronic elements 1090 can also have terminals 1350 at the second surface 1342 configured for interconnection with another component rather than the edge contacts shown in FIG. 10B. In such an embodiment, there can be any number of third microelectronic elements 1090 in the stack, including, for example, two third microelectronic elements 1090a and 1090b, as shown in the embodiment of FIG. 10B.

In one example, the microelectronic package 1310 (or 1510) can include a plurality of third microelectronic elements 1090' mounted onto the first surface 1341 of the substrate 1340 adjacent to one another rather than in a stacked configuration, in a configuration similar to the arrangement of microelectronic elements shown in FIG. 10C. In such an embodiment, the third microelectronic elements 1090' can each have a surface facing the first surface 1341 of the substrate, which is the same surface of the substrate that the front surfaces 1321 and 1331 of the microelectronic elements 1320 and 1330 face. Such a substrate 1340 including third microelectronic elements 1090' can also have terminals 1350 at the second surface 1342 configured for interconnection with another component rather than the edge contacts shown in FIG. 10C. In such an embodiment, there can be any number of third microelectronic elements 1090', including, for example, four microelectronic elements 1090', as shown in the embodiment of FIG. 10C.

Figure 16:
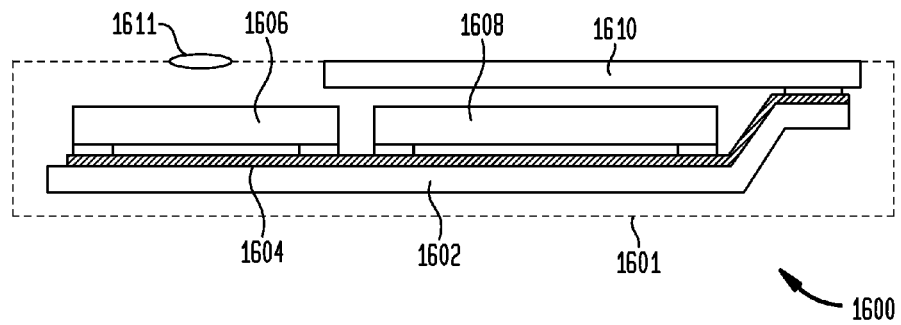
FIG. 16 is a schematic depiction of a system according to one embodiment of the invention.

The modules and microelectronic packages described above with reference to FIGS. 1A through 15 can be utilized in construction of diverse electronic systems, such as the system 1600 shown in FIG. 16. For example, the system 1600 in accordance with a further embodiment of the invention includes one or more modules or components 1606 such as the microelectronic package 1310 described above in conjunction with other electronic components 1608 and 1610.

In the exemplary system 1600 shown, the system can include a circuit panel, motherboard, or riser panel 1602 such as a flexible printed circuit board, and the circuit panel can include numerous conductors 1604, of which only one is depicted in FIG. 16, interconnecting the modules or components 1606 with one another. Such a circuit panel 1602 can transport signals to and from each of the microelectronic packages and/or microelectronic assemblies included in the system 1600. However, this is merely exemplary; any suitable structure for making electrical connections between the modules or components 1606 can be used.

In a particular embodiment, the system 1600 can also include a processor such as the semiconductor chip 1608, such that each module or component 1606 can be configured to transfer a number N of data bits in parallel in a clock cycle, and the processor can be configured to transfer a number M of data bits in parallel in a clock cycle, M being greater than or equal to N.

In the example depicted in FIG. 16, the component 1608 is a semiconductor chip and component 1610 is a display screen, but any other components can be used in the system 1600. Of course, although only two additional components 1608 and 1610 are depicted in FIG. 16 for clarity of illustration, the system 1600 can include any number of such components.

Modules or components 1606 and components 1608 and 1610 can be mounted in a common housing 1601, schematically depicted in broken lines, and can be electrically interconnected with one another as necessary to form the desired circuit. The housing 1601 is depicted as a portable housing of the type usable, for example, in a cellular telephone or personal digital assistant, and screen 1610 can be exposed at the surface of the housing. In embodiments where a structure 1606 includes a light-sensitive element such as an imaging chip, a lens 1611 or other optical device also can be provided for routing light to the structure. Again, the simplified system shown in FIG. 16 is merely exemplary; other systems, including systems commonly regarded as fixed structures, such as desktop computers, routers and the like can be made using the structures discussed above.

Turning to FIG. 17, the first microelectronic element 136 may be any type of semiconductor chip. In this embodiment, the first microelectronic element 136 can be a DRAM (dynamic random access memory) chip having conductive elements thereon. As shown, the surface area of the front surface 140 of the first microelectronic element 136 may be divided into three regions having substantially equal widths in a direction between the first and second edges of the first microelectronic element: a first outer region 1720, a second outer region 1722, and a central region 1724 positioned between the first outer region 1720 and second outer region 1722. For example, if the length between the long edges is 6 microns, the respective lengths of the first outer, second outer, and central regions may be 2 microns. The central region 1724 would therefore be positioned 2 microns from the first edge 144 and 2 microns from the second edge 144. In other words, the central region can be positioned in the middle third of the first microelectronic element 136.

As is typical with regard to DRAM chips, the conductive elements may include first bond pads 142 that extend along the central region 1724 of the front surface 140 of the first microelectronic element 136. The conductive elements provide for an electrical connection between the first microelectronic element 136 and the first set of contacts 109 positioned on the second surface 106 of the substrate 102. An adhesive 101 can be used to attach the first microelectronic element 136 to the substrate 102.

The second microelectronic element 153 may be similar to the first microelectronic element 136. A front surface 157 of the second microelectronic element having bond pads thereon, faces the first microelectronic element 136, such that the second microelectronic element 153 overlies the rear surface 138 of the first microelectronic element 136. As shown in FIG. 18, in this embodiment, the second microelectronic element 153 has opposed first and second edges 161, 162 and opposed third and fourth edges 163, 164 extending between the rear surface 155 and front surface 157 of the second microelectronic element 153 and adjacent first and second edges 161, 162. Conductive elements, such as bond pads 159, extend along the front surface 157 of the second microelectronic element 153. In this embodiment, the second microelectronic element 153 may be a semiconductor chip, such as a DRAM chip, with bond pads 159 positioned along a central region 1732 of the second microelectronic element 153, which is positioned between a first outer region 1728 and a second outer region 1730. In one embodiment, bond pads 159 can extend in a direction transverse to the direction bond pads 142 on the first microelectronic element 136 extend.

A possible benefit of a module or component according to the invention, for example the module 10 described above with reference to FIGS. 1A through 1C, whereby a surface of the first microelectronic element overlies at least a portion of the rear surface of the second microelectronic element can be to provide relatively short leads electrically connecting a particular exposed edge contact (e.g., the exposed edge contact 50) a particular electrical contact (e.g., the electrical contact 24) exposed at a front surface of a particular microelectronic element (e.g., the first microelectronic element 20). Parasitic capacitance can be considerable between adjacent leads, particularly in microelectronic assemblies that have high contact density and fine pitch. In microelectronic assemblies such as the module 10 where the leads 70 can be relatively short, parasitic capacitance can be reduced, particularly between adjacent leads.

Another possible benefit of a module or component according to the invention as described above can be to provide similar lengths of leads such as the leads 70, for example, which can electrically connect data input/output signal terminals (e.g., the exposed edge contacts 50) with electrical contacts 24, 34 at the front surfaces of respective first and second microelectronic elements 20, 30. In systems such as the system 1200 that can include a plurality of modules or components 1206, having relatively similar-length leads 70 can allow the propagation delay for data input/output signals between each microelectronic element and the exposed edge contacts to be relatively closely matched.

Yet another possible benefit of a module or component according to the invention as described above can be to provide similar lengths of leads such as the leads 70, for example, which can electrically connect shared clock signal terminals and/or shared data strobe signal terminals (e.g., the exposed edge contacts 50) with electrical contacts 24, 34 at the front surfaces of respective first and second microelectronic elements 20, 30. The data strobe signal terminals or the clock signal terminals or both may have substantially the same loading and electrical path lengths to the respective microelectronic elements 20, 30 and the path lengths to each microelectronic element can be relatively short.

In any or all of the modules or components described in the foregoing, the rear surface of one or more of the first or second microelectronic elements can be at least partially exposed at an exterior surface of the microelectronic assembly after completing fabrication. Thus, in the assembly described above with respect to FIGS. 1A through 1C, one or both of the rear surfaces 22, 32 of the first and second microelectronic elements 20, 30 can be partially or fully exposed in the completed module 10. The rear surfaces 22, 32 can be partially or fully exposed although an overmold such as the first encapsulant 60, or other encapsulating or packaging structures can contact or be disposed adjacent the microelectronic elements.

In any of the embodiments described above, the microelectronic assembly may include a heat spreader made of metal, graphite or any other suitable thermally conductive material. In one embodiment, the heat spreader includes a metallic layer disposed adjacent to the first microelectronic element. The metallic layer may be exposed on the rear surface of the first microelectronic element. Alternatively, the heat spreader can include an overmold or an encapsulant covering at least the rear surface of the first microelectronic element.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

It will be appreciated that the various dependent claims and the features set forth therein can be combined in different ways than presented in the initial claims. It will also be appreciated that the features described in connection with individual embodiments may be shared with others of the described embodiments.

The invention claimed is:

1. A microelectronic package, comprising:
a substrate having first and second opposed surfaces, a plurality of substrate contacts at the first surface, and a plurality of terminals at the second surface configured to connect with at least one component external to the substrate; and
first and second microelectronic elements, the first microelectronic element having a first surface facing the first surface of the substrate and a second surface opposite therefrom, the first microelectronic element having a lateral edge extending between the first and second surfaces thereof and extending in the second direction, the second microelectronic element having a front surface facing the first surface of the substrate, each microelectronic element having a plurality of element contacts at the front surface thereof, the element contacts of each microelectronic element being joined with corresponding ones of the substrate contacts, the front surface of the second microelectronic element partially overlying a rear surface of the first microelectronic element and attached thereto, the front surface of the second microelectronic element projecting in the first direction beyond the lateral edge of the first microelectronic element,
the second microelectronic element having first and second opposed edges extending between the front and rear surfaces of the second microelectronic element and extending in the first direction, the front surface of the second microelectronic element having a first outer region adjacent the first edge, a second outer region adjacent the second edge, and a central region disposed between the first and second outer regions, each of the first and second outer regions and the central region having equal width such that the central region extends a middle third of a distance between the first and second edges, the element contacts of the second microelectronic element being disposed in two adjacent parallel rows in the central region,
wherein the element contacts of the first microelectronic element are arranged in an area array and are flip-chip bonded with a first set of the substrate contacts, and the element contacts of the second microelectronic element are joined with a second set of the substrate contacts by elongated solder connects, each elongated solder connect having a width that is less than a distance between the corresponding one of the element contacts and the corresponding one of the substrate contacts to which it is joined.

2. The microelectronic package as claimed in claim 1, wherein the element contacts of the second microelectronic element project beyond a lateral edge of the first microelectronic element.

3. The microelectronic package as claimed in claim 1, wherein at least one of the first and second microelectronic elements includes a memory storage element.

4. The microelectronic package as claimed in claim 3, further comprising a plurality of leads extending from at least some of the substrate contacts to the terminals, wherein the leads are configured to carry an address signal configured to address the memory storage element in at least one of the first and second microelectronic elements.

5. The microelectronic package as claimed in claim 1, wherein at least some of the terminals are configured to carry at least one of a signal or a reference potential between the respective terminals and each of the first and second microelectronic elements.

6. The microelectronic package as claimed in claim 1, further comprising a plurality of third microelectronic elements, each third microelectronic element being electrically connected to the substrate.

7. The microelectronic package as claimed in claim 6, wherein the plurality of third microelectronic elements are arranged in a stacked configuration, each of the third microelectronic elements having a front or rear surface confronting a front or rear surface of an adjacent one of the third microelectronic elements.

8. The microelectronic package as claimed in claim 6, wherein the plurality of third microelectronic elements are arranged in a planar configuration, each of the third microelectronic elements having a peripheral surface confronting a peripheral surface of an adjacent one of the third microelectronic elements.

9. The microelectronic package as claimed in claim 6, wherein the second microelectronic element includes volatile RAM, the third microelectronic elements each include nonvolatile flash memory, and the first microelectronic element includes a processor configured to predominantly control transfers of data between an external component and the second and third microelectronic elements.

10. The microelectronic package as claimed in claim 6, wherein the second microelectronic element includes a volatile frame buffer memory storage element, the third microelectronic elements each include nonvolatile flash memory, and the first microelectronic element includes a graphics processor.

11. A module, comprising:
a module card having a first surface, a second surface, and a plurality of parallel exposed edge contacts adjacent an edge of at least one of the first and second surfaces configured to mate with corresponding contacts of a socket, the module card having a plurality of card contacts at the first surface; and
first and second microelectronic elements, the first microelectronic element having a first surface facing the first surface of the module card and a second surface opposite therefrom, the first microelectronic element having a lateral edge extending between the first and second surfaces thereof and extending in the second direction, the second microelectronic element having a front surface facing the first surface of the module card, each microelectronic element having a plurality of element contacts at the front surface thereof, the element contacts of each microelectronic element being joined with corresponding ones of the card contacts, the front surface of the second microelectronic element partially overlying a rear surface of the first microelectronic element and attached thereto, the front surface of the second microelectronic element projecting in the first direction beyond the lateral edge of the first microelectronic element,
the second microelectronic element having first and second opposed edges extending between the front and rear surfaces of the second microelectronic element and extending in the first direction, the front surface of the second microelectronic element having a first outer region adjacent the first edge, a second outer region adjacent the second edge, and a central region disposed between the first and second outer regions, each of the first and second outer regions and the central region having equal width such that the central region extends a middle third of a distance between the first and second edges, the element contacts of the second microelectronic element being disposed in two adjacent parallel rows in the central region, wherein the element contacts of the first microelectronic element are arranged in an area array and are flip-chip bonded with a first set of the card contacts, and the element contacts of the second microelectronic element are joined with a second set of the card contacts by elongated solder connects, each elongated solder connect having a width that is less than a distance between the corresponding one of the element contacts and the corresponding one of the card contacts to which it is joined.

12. The module as claimed in claim 11, wherein the element contacts of the second microelectronic element project beyond a lateral edge of the first microelectronic element.

13. The module as claimed in claim 11, wherein the edge contacts are exposed at at least one of the first or second surfaces of the module card.

14. The module as claimed in claim 11, wherein at least one of the first and second microelectronic elements includes a memory storage element.

15. The module as claimed in claim 14, further comprising a plurality of leads extending from at least some of the card contacts to the edge contacts, wherein the leads are configured to carry an address signal configured to address the memory storage element in at least one of the first and second microelectronic elements.

16. The module as claimed in claim 11, wherein at least some of the edge contacts are configured to carry at least one of a signal or a reference potential between the respective edge contact and each of the first and second microelectronic elements.

17. The module as claimed in claim 11, further comprising a plurality of third microelectronic elements, each third microelectronic element being electrically connected to the module card.

18. The module as claimed in claim 17, wherein the plurality of third microelectronic elements are arranged in a stacked configuration, each of the third microelectronic elements having a front or rear surface confronting a front or rear surface of an adjacent one of the third microelectronic elements.

19. The module as claimed in claim 17, wherein the plurality of third microelectronic elements are arranged in a planar configuration, each of the third microelectronic elements having a peripheral surface confronting a peripheral surface of an adjacent one of the third microelectronic elements.

20. The module as claimed in claim 17, wherein the second microelectronic element includes volatile RAM, the third microelectronic elements each include nonvolatile flash memory, and the first microelectronic element includes a processor configured to predominantly control transfers of data between an external component and the second and third microelectronic elements.

21. The module as claimed in claim 17, wherein the second microelectronic element includes a volatile frame buffer memory storage element, the third microelectronic elements each include nonvolatile flash memory, and the first microelectronic element includes a graphics processor.

* * * * *